US012690359B2

(12) United States Patent
Shin et al.

(10) Patent No.: US 12,690,359 B2
(45) Date of Patent: Jul. 21, 2026

(54) DISPLAY DEVICE

(71) Applicant: Samsung Display Co., LTD., Yongin-si (KR)

(72) Inventors: Dong-Chul Shin, Yongin-si (KR); Yong Seok Kim, Yongin-si (KR); Minhee Son, Yongin-si (KR); Saet Byeol Shin, Yongin-si (KR); Gyujeong Lee, Yongin-si (KR); Bekhyun Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 423 days.

(21) Appl. No.: 18/515,966

(22) Filed: Nov. 21, 2023

(65) Prior Publication Data

US 2024/0349572 A1     Oct. 17, 2024

(30) Foreign Application Priority Data

Apr. 14, 2023    (KR) ........................ 10-2023-0049506

(51) Int. Cl.
*H10K 59/50*        (2023.01)
*G02F 1/167*        (2019.01)
(Continued)

(52) U.S. Cl.
CPC ............. *H10K 59/50* (2023.02); *G02F 1/167* (2013.01); *G02F 1/1677* (2019.01); *G02F 1/1685* (2019.01); *G02F 2203/03* (2013.01)

(58) Field of Classification Search
CPC ............. G02F 1/1323; G02F 1/134318; G02F 1/133512; G02F 1/1352;
(Continued)

(56) References Cited

U.S. PATENT DOCUMENTS

| 8,344,969 B2 | 1/2013 | Yoon et al. |
| 11,075,364 B2 | 7/2021 | Kim et al. |
| | (Continued) | |

FOREIGN PATENT DOCUMENTS

| CN | 218181284 U | 12/2022 |
| KR | 100869810 B1 | 11/2008 |
| | (Continued) | |

OTHER PUBLICATIONS

Written Opinion for International Application No. PCT/KR2024/004464; International Filing Date Apr. 5, 2024; Mail Date Jul. 15, 2024; 3 Pages.

*Primary Examiner* — Julio J Maldonado
*Assistant Examiner* — Eric Manuel Mulero Flores
(74) *Attorney, Agent, or Firm* — CANTOR COLBURN LLP

(57) ABSTRACT

A display device includes: a substrate on which a light emitting area and a non-light emitting area adjacent to the light emitting area are defined, a plurality of light control patterns disposed on the substrate and spaced apart from each other, a common electrode disposed on the plurality of light control patterns, a light blocking layer disposed on the common electrode and overlapping the non-light emitting area, a solvent layer disposed between the common electrode and the light blocking layer, a plurality of electrophoretic particles dispersed in the solvent layer and movable in a horizontal direction of the substrate, and a first control electrode disposed between the common electrode and the light blocking layer, and overlapping the non-light emitting area.

30 Claims, 27 Drawing Sheets

(51) Int. Cl.
   G02F 1/1677 (2019.01)
   G02F 1/1685 (2019.01)
(58) Field of Classification Search
   CPC .... G02F 1/13706–13712; H10K 59/50; H10K
   59/8792
   See application file for complete search history.

(56) References Cited

U.S. PATENT DOCUMENTS

| | | | |
|---|---|---|---|
| 2020/0033689 A1* | 1/2020 | Lee ........................ | G02F 1/1368 |
| 2022/0171249 A1 | 6/2022 | Bregulla et al. | |
| 2023/0341742 A1 | 10/2023 | Lee et al. | |

FOREIGN PATENT DOCUMENTS

| | | |
|---|---|---|
| KR | 101952940 B1 | 5/2019 |
| KR | 20190053571 A | 5/2019 |
| KR | 1020190053571 A | 5/2019 |
| KR | 20200063591 A | 6/2020 |
| KR | 1020230104506 A | 7/2023 |
| WO | 2022050745 A1 | 3/2022 |

* cited by examiner

FIG. 3A

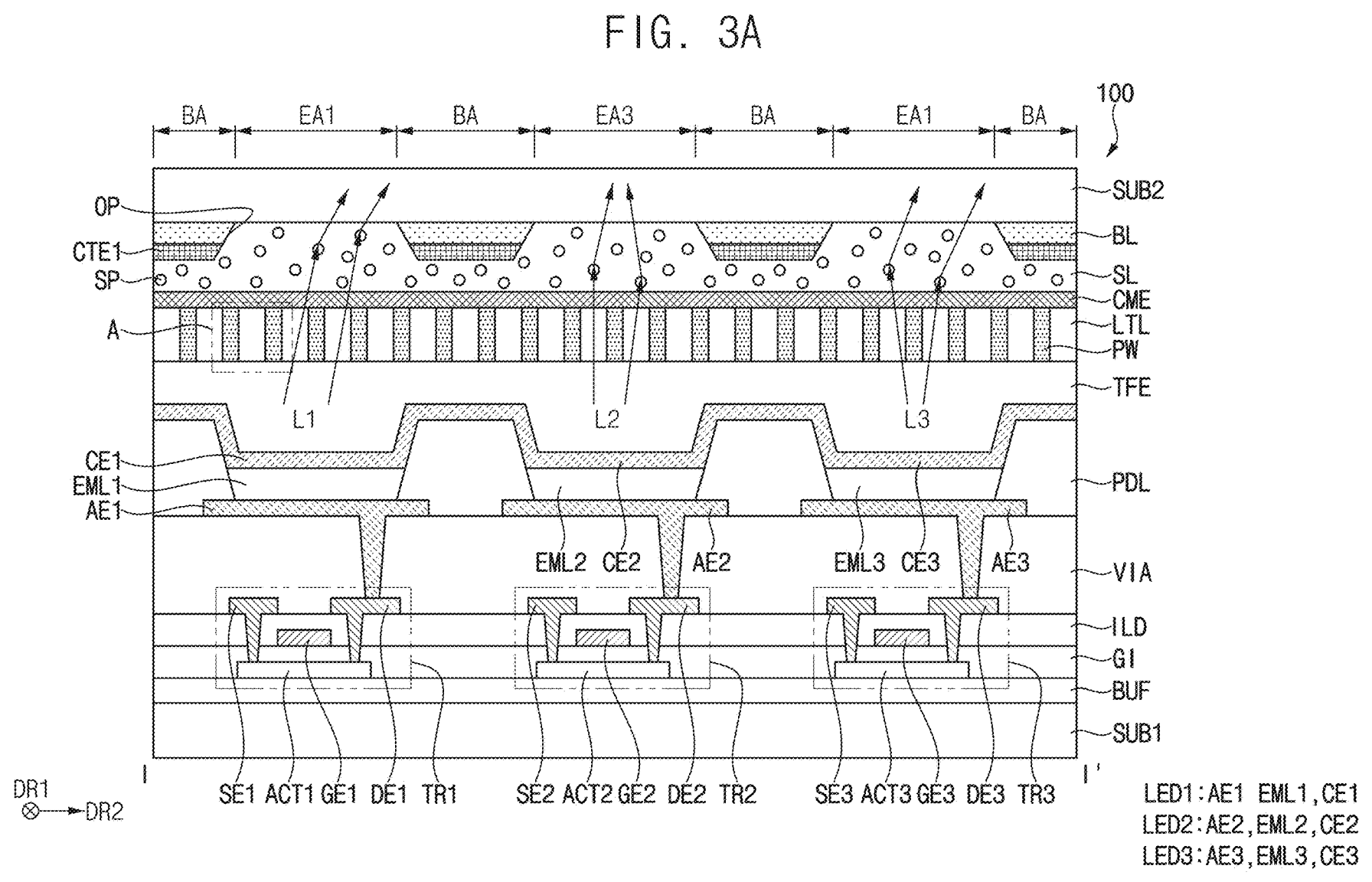

LED1 : AE1, EML1, CE1
LED2 : AE2, EML2, CE2
LED3 : AE3, EML3, CE3

100

SUB2
BL
SL
CME
LTL
PW
TFE

PDL

VIA
ILD
G1
BUF
SUB1

OP
CTE1
SP
A

CE1
EML1
AE1

BA  EA1  BA  EA3  BA  EA1  BA

L1
L2
L3

AE3
CE3
EML3

AE2
CE2
EML2

SE1 ACT1 GE1 DE1 TR1    SE2 ACT2 GE2 DE2 TR2    SE3 ACT3 GE3 DE3 TR3

DR1
DR2

PW:PW1,PW2,PW3

LED1 : AE1  EML1, CE1
LED2 : AE2, EML2, CE2
LED3 : AE3, EML3, CE3

LED1: AE1 EML1, CE1
LED2: AE2, EML2, CE2
LED3: AE3, EML3, CE3

LED1:AE1,EML1,CE1
LED2:AE2,EML2,CE2
LED3:AE3,EML3,CE3

FIG. 22B

LED1:AE1, EML1, CE1
LED2:AE2, EML2, CE2
LED3:AE3, EML3, CE3

CTE1  CTE2

CE

CNT

DR2

DR1

F I G. 27
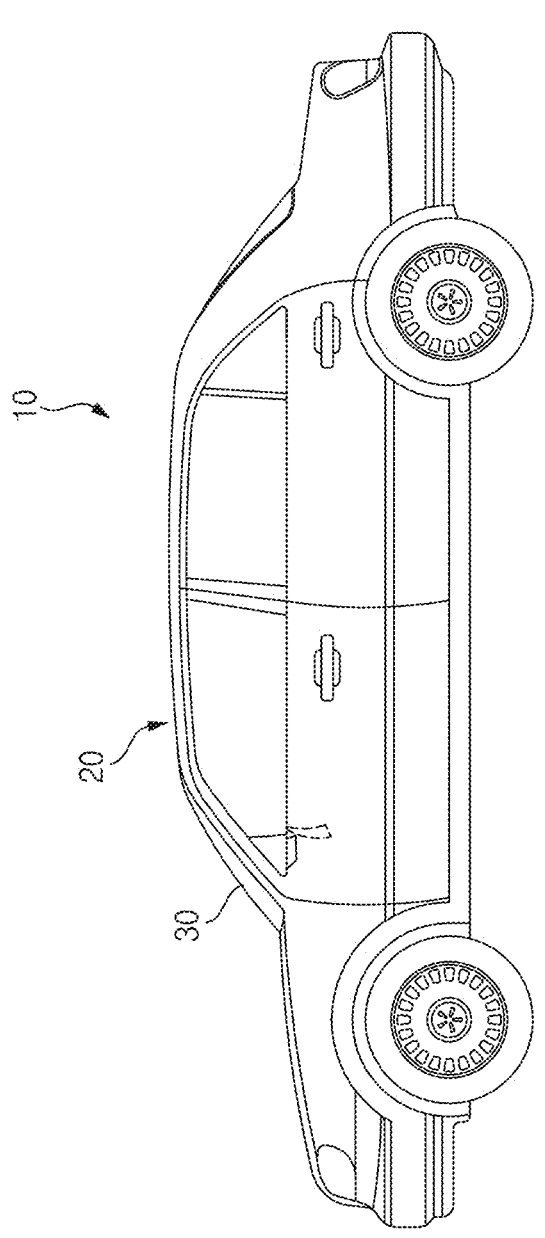

DISPLAY DEVICE

This application claims priority to Korean Patent Application No. 10-2023-0049506, filed on Apr. 14, 2023, and all the benefits accruing therefrom under 35 U.S.C. § 119, the content of which in its entirety is herein incorporated by reference.

BACKGROUND

1. Field

Embodiments provide generally to a display device. More particularly, embodiments relate to the display device that provides visual information.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

Such a display device may be desired to control a viewing angle of an image displayed thereon to display an image having a wide viewing angle or to display an image having a narrow viewing angle to improve security or image reflection.

SUMMARY

Embodiments provide a display device capable of effectively controlling a viewing angle.

A display device according to embodiments of the disclosure includes a substrate on which a light emitting area and a non-light emitting area adjacent to the light emitting area are defined, a plurality of light control patterns disposed on the substrate and spaced apart from each other, a common electrode disposed on the plurality of light control patterns, a light blocking layer disposed on the common electrode and overlapping the non-light emitting area, a solvent layer disposed between the common electrode and the light blocking layer, a plurality of electrophoretic particles dispersed in the solvent layer and movable in a horizontal direction of the substrate, and a first control electrode disposed between the common electrode and the light blocking layer, and overlapping the non-light emitting area.

In an embodiment, when a first voltage is applied to the common electrode and a second voltage having a magnitude different from a magnitude of the first voltage is applied to the first control electrode, the plurality of electrophoretic particles may move into a space between the common electrode and the first control electrode.

In an embodiment, the first control electrode may directly contact one surface of the light blocking layer facing the substrate.

In an embodiment, the display device may further include a light transmission layer disposed between the plurality of light control patterns on the substrate and including a transparent organic material.

In an embodiment, the light transmission layer may include a protruding part protruding toward the common electrode from an upper surface of the transmission layer and overlapping the light emitting area.

In an embodiment, the display device may further include a second control electrode disposed on the common electrode and overlapping the light emitting area.

In an embodiment, when a first voltage is applied to the common electrode, a second voltage having a magnitude different from a magnitude of the first voltage is applied to the first control electrode, and the first voltage is applied to the second control electrode, the plurality of electrophoretic particles may move into a space between the common electrode and the first control electrode.

In an embodiment, an opening overlapping the light emitting area may be defined in the light blocking layer and the second control electrode is disposed in the opening.

In an embodiment, the first control electrode may include a plurality of first electrode patterns spaced apart from each other in a first direction, and each of the plurality of first electrode patterns may extend in a second direction crossing the first direction.

In an embodiment, the second control electrode may include a plurality of second electrode patterns spaced apart from each other in the first direction, and each of the plurality of first electrode patterns may extend in the second direction.

In an embodiment, the second control electrode may partially overlap the non-light emitting area.

In an embodiment, a driving voltage or a common voltage may be applied to the second control electrode.

In an embodiment, the display device may further include an anode electrode disposed in the light emitting area on the substrate, a light emitting layer disposed on the anode electrode, and a cathode electrode disposed on the light emitting layer.

In an embodiment, the second control electrode may be electrically connected to the cathode electrode.

In an embodiment, the display device may further include a light transmission layer disposed between the plurality of light control patterns on the substrate and including a transparent organic material. In such an embodiment, the light transmission layer may include a protruding part protruding toward the common electrode from an upper surface of the transmission layer and overlapping the light emitting area.

In an embodiment, each of the plurality of electrophoretic particles may be a transparent light scattering particle.

In an embodiment, each of the plurality of light control patterns may include molybdenum tantalum oxide (MTO).

In an embodiment, each of the plurality of light control patterns may include an organic material including at least one selected from black pigment and a black dye.

In an embodiment, each of the plurality of light control patterns may have a multi-layer structure.

In an embodiment, each of the plurality of light control patterns may have a two-layer structure including a first sub-partition wall and a second sub-partition wall disposed on the first sub-partition wall.

In an embodiment, each of the plurality of light control patterns may have a three-layer structure including a first sub-partition wall, a second sub-partition wall disposed on the first sub-partition wall, and a third sub-partition wall disposed on the second sub-partition wall.

In an embodiment, the plurality of light control patterns may be spaced apart from each other in a first direction and each of the plurality of light control patterns may extend in a second direction crossing the first direction.

In an embodiment, the display device may further include a touch sensing layer disposed between the substrate and the common electrode, where the touch sensing layer may sense a touch of a user.

A display device according to embodiments of the disclosure includes a substrate on which first, second, and third light emitting areas, which emit light of different colors, and a non-light emitting area adjacent to the first, second, and third light emitting areas are defined, a plurality of light control patterns disposed on the substrate, overlapping the first, second, and third light emitting areas and the non-light emitting area, and spaced apart from each other, a common electrode disposed on the plurality of light control patterns and overlapping the first, second, and third light emitting areas, a light blocking layer disposed on the common electrode and overlapping the non-light emitting area, a solvent layer disposed between the common electrode and the light blocking layer, a plurality of electrophoretic particles dispersed in the solvent layer and movable in a horizontal direction of the substrate, and a first control electrode disposed between the common electrode and the light blocking layer, and overlapping the non-light emitting area.

In an embodiment, when a first voltage is applied to the common electrode and a second voltage having a magnitude different from a magnitude of the first voltage is applied to the first control electrode, the plurality of electrophoretic particles may move into a space between the common electrode and the first control electrode.

In an embodiment, the first control electrode may directly contact one surface of the light blocking layer facing the substrate.

In an embodiment, the display device may further include a light transmission layer disposed between the plurality of light control patterns on the substrate and including a transparent organic material. In such an embodiment, the light transmission layer may include a protruding part protruding toward the common electrode from an upper surface of the transmission layer and overlapping the first, second, and third light emitting areas.

In an embodiment, the display device may further include a second control electrode disposed on the common electrode and overlapping the light emitting area. In such an embodiment, when a first voltage is applied to the common electrode, a second voltage having a magnitude different from a magnitude of the first voltage is applied to the first control electrode, and the first voltage is applied to the second control electrode, the plurality of electrophoretic particles may move into a space between the common electrode and the first control electrode.

In an embodiment, each of the plurality of electrophoretic particles may be a transparent light scattering particle.

In an embodiment, each of the plurality of light control patterns may include an inorganic material or an organic material.

A display device according to embodiments of the disclosure may include a plurality of light control patterns disposed on a substrate and spaced apart from each other, a common electrode disposed on the plurality of light control patterns, a light blocking layer disposed on the common electrode and overlapping a non-light emitting area, a solvent layer disposed between the common electrode and the light blocking layer, a plurality of electrophoretic particles dispersed in the solvent layer and movable in a horizontal direction of the substrate, and a first control electrode disposed between the common electrode and the light blocking layer, and overlapping the non-light emitting area.

In such embodiments, since the display device does not include a separate light blocking film for controlling the viewing angle, a thickness of the display device can be reduced and the manufacturing cost of the display device can be reduced. In such embodiments, a first mode state implementing a wide viewing angle and a second mode state implementing a narrow viewing angle may be freely switched as desired by selectively applying voltages to the common electrode and the first control electrode.

BRIEF DESCRIPTION OF THE DRAWINGS

Illustrative, non-limiting embodiments will be more clearly understood from the following detailed description in conjunction with the accompanying drawings.

FIGS. 3A and 3B are cross-sectional views taken along line I-I' of FIG. 2.

FIGS. 22A and 22B are cross-sectional views illustrating a display device according to still another alternative embodiment of the disclosure.

FIG. 25 is a plan view illustrating a cathode electrode, a first control electrode, and a second control electrode of FIGS. 22A and 22B.

FIG. 27 is a schematic view of an automobile.

DETAILED DESCRIPTION

Figure 1:
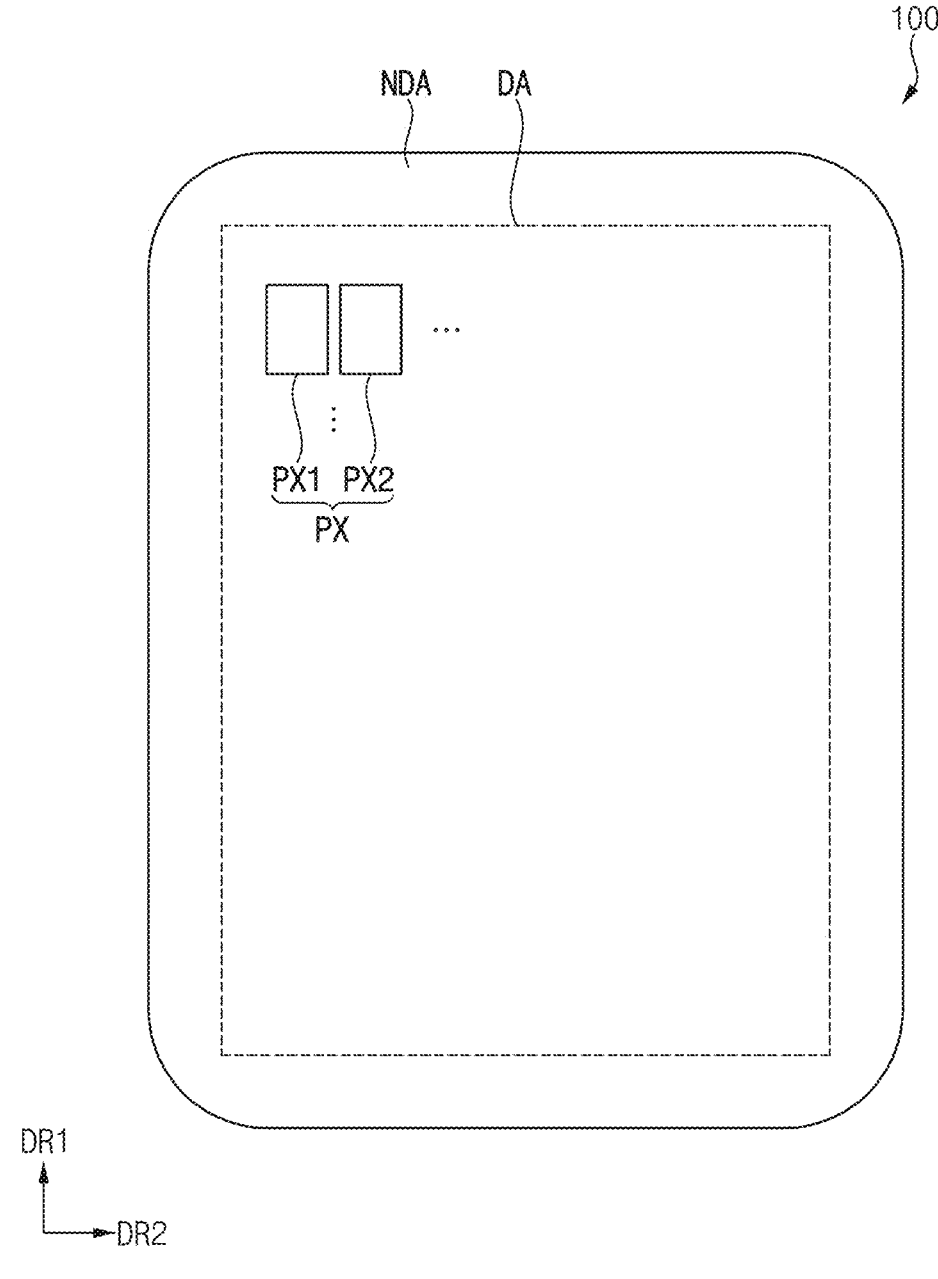
FIG. 1 is a plan view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numbers have been used for like elements in describing each drawing. In the accompanying drawings, the dimensions of the structures are shown enlarged than actual for clarity of the disclosure. Terms such as first and second may be used to describe various components, but the components should not be limited by the terms. The terms are only used for the purpose of distinguishing one component from another component. For example, a first component may be termed a second component, and similarly, a second component may be termed a first component, without departing from the scope of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In this application, when a part such as a layer, film, area, plate, or the like is said to be "on" another part, this includes not only being "directly on" the other part, but also having another part in between. Conversely, when a part such as a layer, film, area, plate, or the like is said to be "under" another part, this includes not only being "directly under" the other part, but also having another part in between. In addition, in the application, being disposed "on" may include the case of being disposed not only on a part but also under a part.

In this application, "directly disposed" may mean that there is no added the layer, film, area, plate, or the like between a part of layer, film, area, plate, or the like and another part. For example, being "directly disposed" may mean disposing without using an additional member such as an adhesive member between two layers or two members.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings. The same reference numerals are used for the same components in the drawings, and any repetitive detailed descriptions of the same components will be omitted or simplified.

FIG. 1 is a plan view illustrating a display device according to an embodiment of the disclosure.

Referring to FIG. 1, a display device 100 according to an embodiment of the disclosure may include a display area DA and a non-display area NDA.

A plurality of pixels PX may be disposed in the display area DA. Each of the plurality of pixels PX may emit light. In an embodiment, the plurality of pixels PX may include a first pixel PX1 and a second pixel PX2. In an embodiment, for example, the first pixel PX1 and the second pixel PX2 may simultaneously emit light. Alternatively, when the first pixel PX1 emits light, the second pixel PX2 may not emit light. Alternatively, when the first pixel PX1 does not emit light, the second pixel PX2 may emit light. As the plurality of pixels PX emits light, the display area DA may display an image.

The plurality of pixels PX may be repeatedly arranged along a first direction DR1 and a second direction DR2 crossing the first direction DR1 in a plan view. For example, the second pixel PX2 may be adjacent to the first pixel PX1. Specifically, the second pixel PX2 may be adjacent to the first pixel PX1 in the second direction DR2.

The non-display area NDA may be positioned around the display area DA. In an embodiment, for example, the non-display area NDA may surround at least a part of the display area DA. A driver may be disposed in the non-display area NDA. The driver may provide signals and/or voltages to the plurality of pixels PX. In an embodiment, for example, the driver may include a data driver, a gate driver, or the like. The non-display area NDA may not display an image.

In this specification, a plane may be defined by the first direction DR1 and the second direction DR2. For example, the first direction DR1 may be perpendicular to the second direction DR2.

Figure 2:
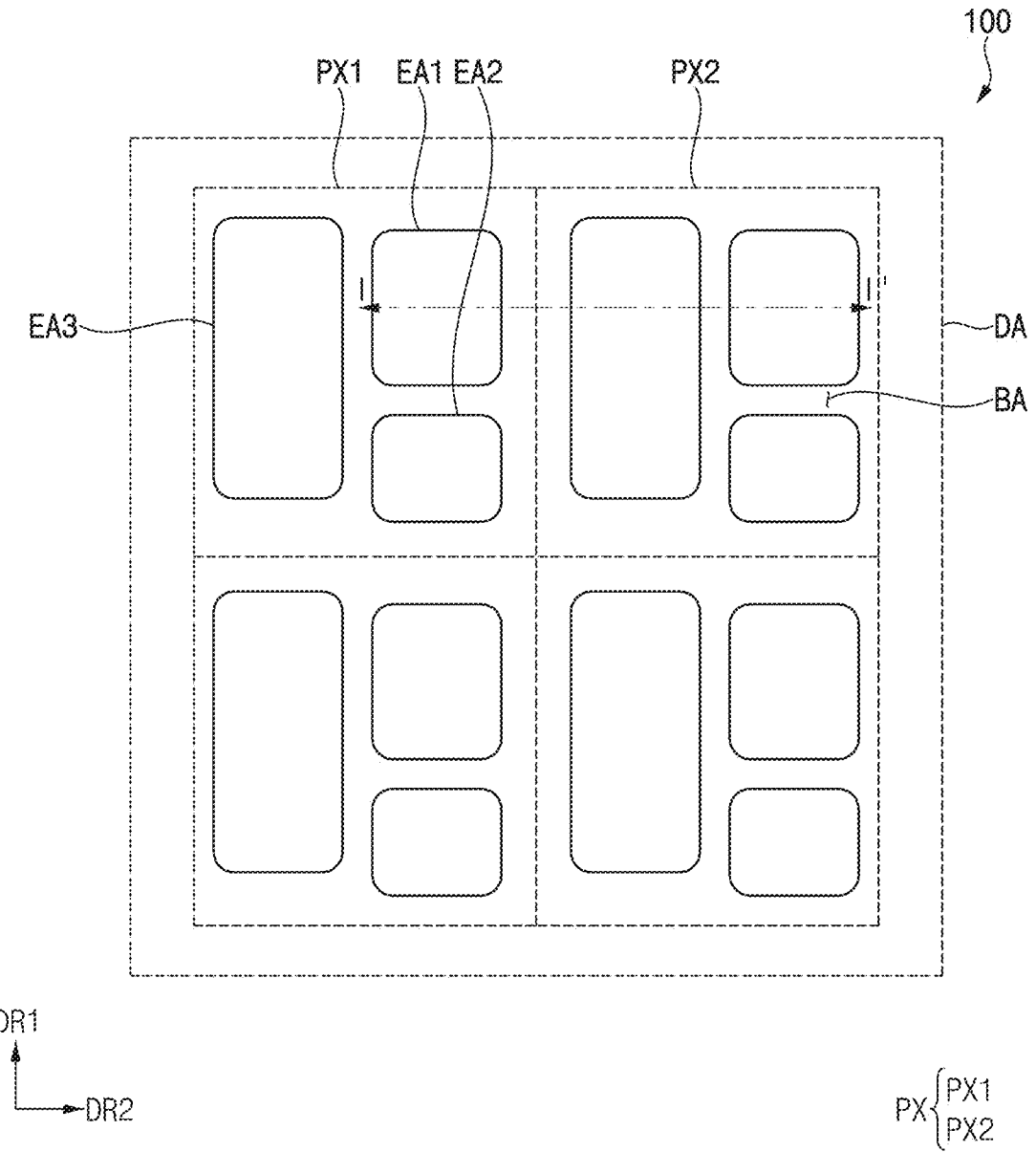
FIG. 2 is an enlarged plan view of a part of the display area of FIG. 1.

FIG. 2 is an enlarged plan view of a part of the display area of FIG. 1.

Referring to FIGS. 1 and 2, as described above, an embodiment of the display device 100 may include the display area DA and the non-display area NDA, and the plurality of pixels PX may be disposed in the display area DA. The plurality of pixels PX may include the first pixel PX1 and the second pixel PX2.

Each of the first pixel PX1 and the second pixel PX2 may include a first light emitting area EA1, a second light emitting area EA2, a third light emitting area EA3, and a non-light emitting area BA.

The first light emitting area EA1 may emit light of a first color, the second light emitting area EA2 may emit light of a second color, and the third light emitting area EA3 may emit light of a third color. In an embodiment, the first color may be red, the second color may be green, and the third color may be blue. As the light of the first color, the light of the second color, and the light of the third color are combined with each other, each of the first pixel PX1 and the second pixel PX2 may emit light of various colors. The non-light emitting area BA may not emit light.

Figure 3B:
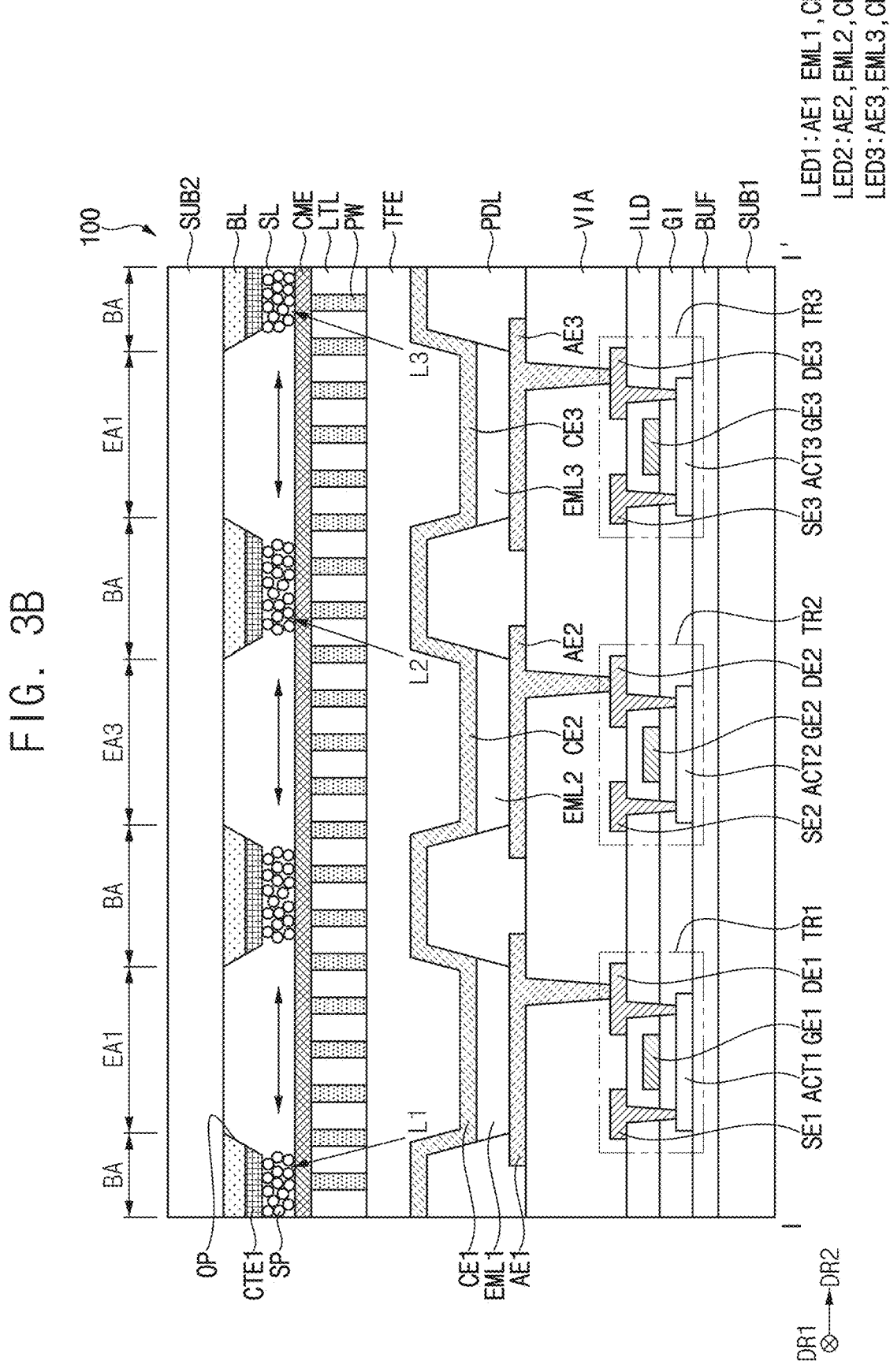

FIGS. 3A and 3B are cross-sectional views taken along line I-I' of FIG. 2. Particularly, FIG. 3A may show the display device 100 in a first mode state, and FIG. 3B may show the display device 100 in a second mode state. Here, the first mode state may mean a mode for implementing a wide viewing angle, and the second mode state may mean a mode for implementing a narrow viewing angle.

Referring to FIGS. 3A and 3B, the display device 100 according to an embodiment of the disclosure may include a first substrate SUB1, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements LED1, LED2, and LED3, an encapsulation layer TFE, a light transmission layer LTL, a plurality of light control patterns PW, a common electrode CME, a solvent layer SL, a plurality of electrophoretic particles SP, a first control electrode CTE1, a light blocking layer BL, and a second substrate SUB2.

In an embodiment, the first transistor TR1 may include a first active pattern ACT1, a first gate electrode GE1, a first source electrode SE1 and a first drain electrode DE1, the second transistor TR2 may include a second active pattern ACT2, a second gate electrode GE2, a second source electrode SE2 and a second drain electrode DE2, and the third transistor TR3 may include a third active pattern ACT3, a third gate electrode GE3, a third source electrode SE3 and a third drain electrode DE3.

In such an embodiment, the first light emitting element LED1 may include a first anode electrode AE1, a first light emitting layer EML1 and a first cathode electrode CE1, the second light emitting element LED2 may include a second anode electrode AE2, a second light emitting layer EML2 and a second cathode electrode CE2, and the third light emitting element LED3 may include a third anode electrode AE3, a third light emitting layer EML3 and a third cathode electrode CE3.

The first substrate SUB1 may include a transparent material or an opaque material. In an embodiment, the first substrate SUB1 may include or be formed of a transparent resin substrate. Examples of the transparent resin substrate may include polyimide substrate or the like. In such an embodiment, the first substrate SUB1 may include a first organic layer, a first barrier layer, and a second organic layer. Alternatively, the first substrate SUB1 may include a quartz substrate, a synthetic quartz substrate, a calcium fluoride substrate, an F-doped quartz substrate, a soda lime glass substrate, a non-alkali glass substrate, or the like. These may be used alone or in combination with each other.

The buffer layer BUF may be disposed on the first substrate SUB1. The buffer layer BUF may prevent diffusion of metal atoms or impurities from the first substrate SUB1 to the first, second, and third transistors TR1, TR2, and TR3. In addition, the buffer layer BUF may improve the flatness of the surface of the first substrate SUB1 when the surface of the first substrate SUB1 is not uniform. In an embodiment, for example, the buffer layer BUF may include an inorganic material such as silicon oxide ($SiO_x$), silicon nitride ($SiN_x$), silicon oxynitride ($SiO_xN_y$), or the like. These may be used alone or in combination with each other.

The first, second, and third active patterns ACT1, ACT2, and ACT3 may be disposed on the buffer layer BUF. Each of the first, second, and third active patterns ACT1, ACT2, and ACT3 may include a metal oxide semiconductor, an inorganic semiconductor (e.g., amorphous silicon, poly silicon, and the like), or an organic semiconductor. Each of the first, second, and third active patterns ACT1, ACT2, and ACT3 may include a source region, a drain region, and a channel region positioned between the source region and the drain region. The first, second, and third active patterns ACT1, ACT2, and ACT3 may be formed through a same process and include a same material as each other.

The metal oxide semiconductor may include a two-component compound ($AB_x$), a three-component compound ($AB_xC_y$), a four-component compound ($AB_xC_yD_z$), and the like containing indium (In), zinc (Zn), gallium (Ga), tin (Sn), titanium (Ti), aluminum (Al), hafnium (Hf), zirconium (Zr), magnesium (Mg), or the like. For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide (ITO), indium zinc tin oxide (IZTO), indium gallium zinc oxide (IGZO), or the like. These may be used alone or in combination with each other.

The gate insulating layer GI may be disposed on the buffer layer BUF. In an embodiment, the gate insulating layer GI may sufficiently cover the first, second, and third active patterns ACT1, ACT2, and ACT3, and may have a substantially flat upper surface without any step structure thereon around the first, second, and third active patterns ACT1, ACT2, and ACT3. Alternatively, the gate insulating layer GI may cover the first, second, and third active patterns ACT1, ACT2, and ACT3 and may be disposed along the profile of each of the first, second, and third active patterns ACT1, ACT2, and ACT to have a uniform thickness. In an embodiment, for example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The first, second, and third gate electrodes GE1, GE2, and GE3 may be disposed on the gate insulating layer GI. The first gate electrode GE1 may overlap the channel region of the first active pattern ACT1, the second gate electrode GE2 may overlap the channel region of the second active pattern ACT2, and the third gate electrode GE3 may overlap the channel region of the third active pattern ACT3.

Each of the first, second, and third gate electrodes GE1, GE2, and GE3 may include a metal, an alloy metal nitride, a conductive metal oxide, a transparent conductive material, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. Examples of the conductive metal oxide may include indium tin oxide, indium zinc oxide, or the like. In addition, examples of the metal nitride may include aluminum nitride ($AlN_x$), tungsten nitride ($WN_x$), chromium nitride ($CrN_x$), or the like. These may be used alone or in combination with each other.

The first, second, and third gate electrodes GE1, GE2, and GE3 may be formed through a same process and include a same material as each other.

The interlayer insulating layer ILD may be disposed on the gate insulating layer GI. The interlayer insulating layer ILD may sufficiently cover the first, second, and third gate electrodes GE1, GE2, and GE3, and may have a substantially flat upper surface without any step structure defined thereon around the first, second, and third gate electrodes GE1, GE2, and GE3. Alternatively, the interlayer insulating layer ILD may cover the first, second, and third gate electrodes GE1, GE2, and GE3 and may be disposed along the profile of each of the first, second, and third gate electrodes GE1, GE2, and GE3 to have a uniform thickness. In an embodiment, for example, the interlayer insulating layer ILD may include an inorganic material such as silicon oxide, silicon nitride, silicon carbide, silicon oxynitride, silicon oxycarbide, or the like. These may be used alone or in combination with each other.

The first, second, and third source electrodes SE1, SE2, and SE3 may be disposed on the interlayer insulating layer ILD. The first source electrode SE1 may be connected to the source region of the first active pattern ACT1 through a contact hole defined through the gate insulating layer GI and the interlayer insulating layer ILD. The second source electrode SE2 may be connected to the source region of the second active pattern ACT2 through a contact hole defined through the gate insulating layer GI and the interlayer insulating layer ILD. The third source electrode SE3 may be connected to the source region of the third active pattern ACT3 through a contact hole defined through the gate insulating layer GI and the interlayer insulating layer ILD.

The first, second, and third drain electrodes DE1, DE2, and DE3 may be disposed on the interlayer insulating layer ILD. The first drain electrode DE1 may be connected to the drain region of the first active pattern ACT1 through a contact hole defined through the gate insulating layer GI and the interlayer insulating layer ILD. The second drain electrode DE2 may be connected to the drain region of the second active pattern ACT2 through a contact hole defined through the gate insulating layer GI and the interlayer insulating layer ILD. The third drain electrode DE3 may be connected to the drain region of the third active pattern ACT3 through a contact hole defined through the gate insulating layer GI and the interlayer insulating layer ILD.

In an embodiment, for example, each of the first, second, and third source electrodes SE1, SE2, and SE3 may include a metal, an alloy, a metal nitride, a conductive metal oxide, a transparent conductive material, or the like. These may be used alone or in combination with each other. The first, second, and third drain electrodes DE1, DE2, and DE3 may be formed through the same process as the first, second, and third source electrodes SE1, SE2, and SE3 and may include a same material as the first, second, and third source electrodes SE1, SE2, and SE3.

Accordingly, the first transistor TR1 including the first active pattern ACT1, the first gate electrode GE1, the first source electrode SE1, and the first drain electrode DE1 may be disposed on the first substrate SUB1. The second transistor TR2 including the second active pattern ACT2, the second gate electrode GE2, the second source electrode SE2, and the second drain electrode DE2 may be disposed on the first substrate SUB1. The third transistor TR3 including the third active pattern ACT3, the third gate electrode GE3, the third source electrode SE3, and the third drain electrode DE3 may be disposed on the first substrate SUB1.

The via insulating layer VIA may be disposed on the interlayer insulation layer ILD. The via insulating layer VIA may sufficiently cover the first, second, and third source electrodes SE1, SE2, and SE3 and the first, second, and third drain electrodes DE1, DE2, and DE3. The via insulating layer VIA may include an organic material. In an embodiment, for example, the via insulating layer VIA may include phenolic resin, polyacrylates resin, polyimides rein, polyamides resin, siloxane resin, epoxy resin, or the like. These may be used alone or in combination with each other.

The first, second, and third anode electrodes AE1, AE2, and AE3 may be disposed on the via insulating layer VIA. Each of the first anode electrode AE1 and the third anode electrode AE3 may overlap the first light emitting area EA1, and the second anode electrode AE2 may overlap the third light emitting area EA3. The first anode electrode AE1 may be connected to the first drain electrode DE1 through a contact hole defined through the via insulating layer VIA, the second anode electrode AE2 may be connected to the second drain electrode DE2 through a contact hole defined through the via insulating layer VIA, and the third anode electrode AE3 may be connected to the third drain electrode DE3 through a contact hole defined through the via insulating layer VIA.

In an embodiment, each of the first, second, and third anode electrodes AE1, AE2, and AE3 may include a metal, an alloy, a metal nitride, a conductive metal oxide, a transparent conductive material, or the like. These may be used alone or in combination with each other. In an embodiment, for example, each of the first, second, and third anode electrodes AE1, AE2, and AE3 may have a stacked structure including ITO/Ag/ITO. The first, second, and third anode electrodes AE1, AE2, and AE3 may be formed through a same process and include a same material as each other.

The pixel defining layer PDL may be disposed on the via insulating layer VIA. The pixel defining layer PDL may overlap the non-light emitting area BA. The pixel defining layer PDL may cover edges of each of the first, second, and third anode electrodes AE1, AE2, and AE3. In addition, an opening exposing at least a part of the upper surface of each of the first, second, and third anode electrodes AE1, AE2, and AE3 may be defined in the pixel defining layer PDL. In an embodiment, for example, the pixel defining layer PDL may include an inorganic material and/or an organic material. In an embodiment, the pixel defining layer PDL may include an organic material such as an epoxy resin, a siloxane resin, or the like. These may be used alone or in combination with each other. In an alternative embodiment, the pixel defining layer PDL may include an inorganic material and/or an organic material containing a light blocking material such as black pigment, black dye, or the like.

The first light emitting layer EML1 may be disposed on the first anode electrode AE1, the second light emitting layer EML2 may be disposed on the second anode electrode AE2, and the third light emitting layer EML3 may be disposed on the third anode electrode AE3. Each of the first, second, and third light emitting layers EML1, EML2, and EML3 may include an organic material that emits light of a predetermined color. In an embodiment, for example, each of the first light emitting layer EML1 and the third light emitting layer EML3 may include an organic material that emits red light, and the second light emitting layer EML2 may include an organic material that emits blue light.

The first cathode electrode CE1 may be disposed on the first light emitting layer EML1 and the pixel defining layer PDL, the second cathode electrode CE2 may be disposed on the second light emitting layer EML2 and the pixel defining layer PDL, and the third cathode electrode CE3 may be disposed on the third light emitting layer EML3 and the pixel defining layer PDL. The first, second, and third cathode electrodes CE1, CE1, and CE3 may be integrally formed with each other as a single unitary and indivisible part. In an embodiment, for example, each of the first, second, and third cathode electrodes CE1, CE1, and CE3 may include a metal, an alloy, a metal nitride, a conductive metal oxide, a transparent conductive material, or the like. These may be used alone or in combination with each other.

Accordingly, the first light emitting element LED1 including the first anode electrode AE1, the first light emitting layer EML1, and the first cathode electrode CE1 may be disposed on the first light emitting area EA1 on the first substrate SUB1, and the second light emitting element LED2 including the second anode electrode AE2, the second light emitting layer EML2, and the second cathode electrode CE2 may be disposed in the third light emitting area EA3 on the first substrate SUB1. In addition, the third light emitting element LED3 including the third anode electrode AE3, the third light emitting layer EML3, and the third cathode electrode CE3 may be disposed in the first light emitting area EA1 on the first substrate SUB1.

The encapsulation layer TFE may be disposed on the first, second, and third cathode electrodes CE1, CE2, and CE3. The encapsulation layer TFE may prevent impurities, moisture, air, and the like from permeating the first, second, and third light emitting elements LED1, LED2, and LED3 from the outside. The encapsulation layer TFE may include at least one inorganic layer and at least one organic layer. For example, the inorganic layer may include silicon oxide, silicon nitride, silicon oxynitride, or the like. These may be used alone or in combination with each other. The organic layer may include a polymer cured material such as polyacrylate or the like.

In an embodiment, the plurality of light control patterns PW may be disposed on the encapsulation layer TFE. In an embodiment, for example, where the display device 100 is a top light emitting type, the plurality of light control patterns PW may be disposed on the first, second, and third light emitting elements LED1, LED2, and LED3. Alternatively, where the display device 100 is a bottom light emitting type, the plurality of light control patterns PW may be disposed under the first, second, and third light emitting elements LED1, LED2, and LED3.

The plurality of light control patterns PW may be spaced apart from each other in the second direction DR2. In addition, the plurality of light control patterns PW may be parallel to each other.

Light emitted from the first, second, and third light emitting elements LED1, LED2, and LED3 may be incident on the plurality of light control patterns PW or may pass areas between the plurality of light control patterns PW. The light incident on the plurality of light control patterns PW may be reflected from the plurality of light control patterns PW, pass through areas between the plurality of light control patterns PW, or be absorbed by the plurality of light control patterns PW.

In an embodiment, reflectance of the plurality of light control patterns PW may be about 20% or less. In an embodiment, for example, reflectance of the plurality of light control patterns PW may be in a range of about 4% to about 8%. In an embodiment, transmittance of the plurality of light control patterns PW may be about 10% or less. In an embodiment, for example, transmittance of the plurality of light control patterns PW may be about 1% or less. In such an embodiment, most of the light incident on the plurality of light control patterns PW may be absorbed by the plurality of light control patterns PW.

Each of the plurality of light control patterns PW may include an inorganic material. In an embodiment, each of the plurality of light control patterns PW may include molybdenum-tantalum oxide (MTO). In an embodiment, for example, each of the plurality of light control patterns PW may include MTO, MTO/Mo, MTO/Cu, MTO/Al, MTO/Mo/MTO, MTO/Cu/MTO, MTO/Al/MTO, or the like. These may be used alone or in combination with each other. However, each of the plurality of light control patterns PW is not limited to including MTO, and may include various materials having relatively low transmittance and reflectance and relatively high absorbance.

In an embodiment where each of the plurality of light control patterns PW includes MTO, each of the plurality of light control patterns SW may have a single-layer structure or a multi-layer structure. In such an embodiment, the plurality of light control patterns PW may be manufactured by the manufacturing method described with reference to FIGS. 10, 11, 12, and 13.

In an alternative embodiment, each of the plurality of light control patterns PW may include an organic material containing a light blocking material such as black pigment, black dye, or the like. In such an embodiment, the plurality of light control patterns PW may be manufactured by the manufacturing method described with reference to FIGS. 14, 15, 16, 17, 18, and 19.

Figure 4:
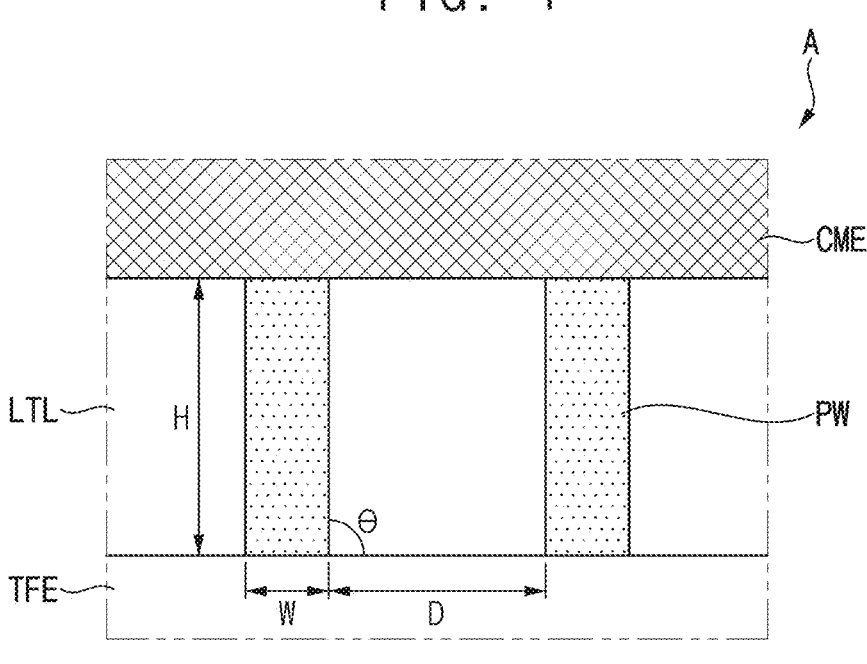
FIG. 4 is a cross-sectional view illustrating an example of area A of FIG. 3A.
Figure 5:
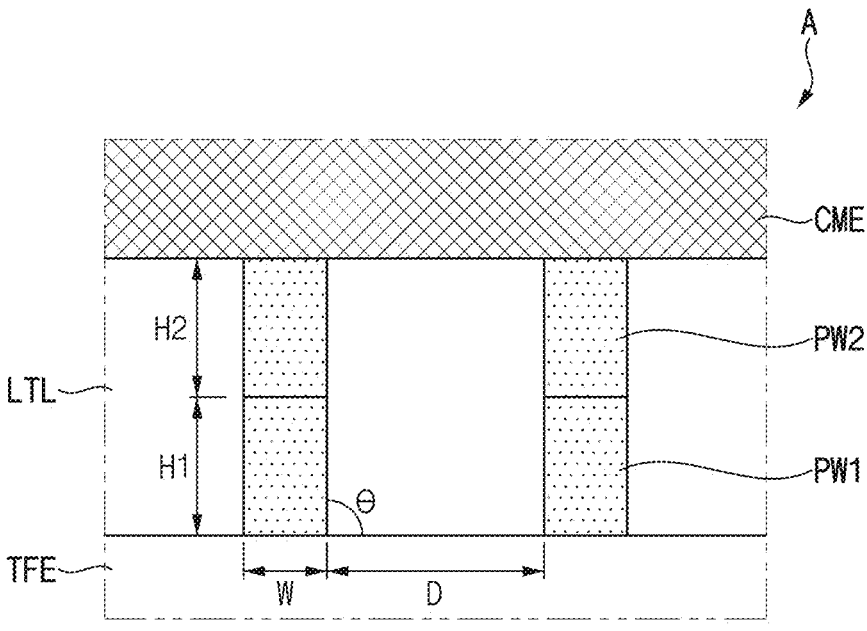
FIG. 5 is a cross-sectional view illustrating another example of area A of FIG. 3A.
Figure 6:
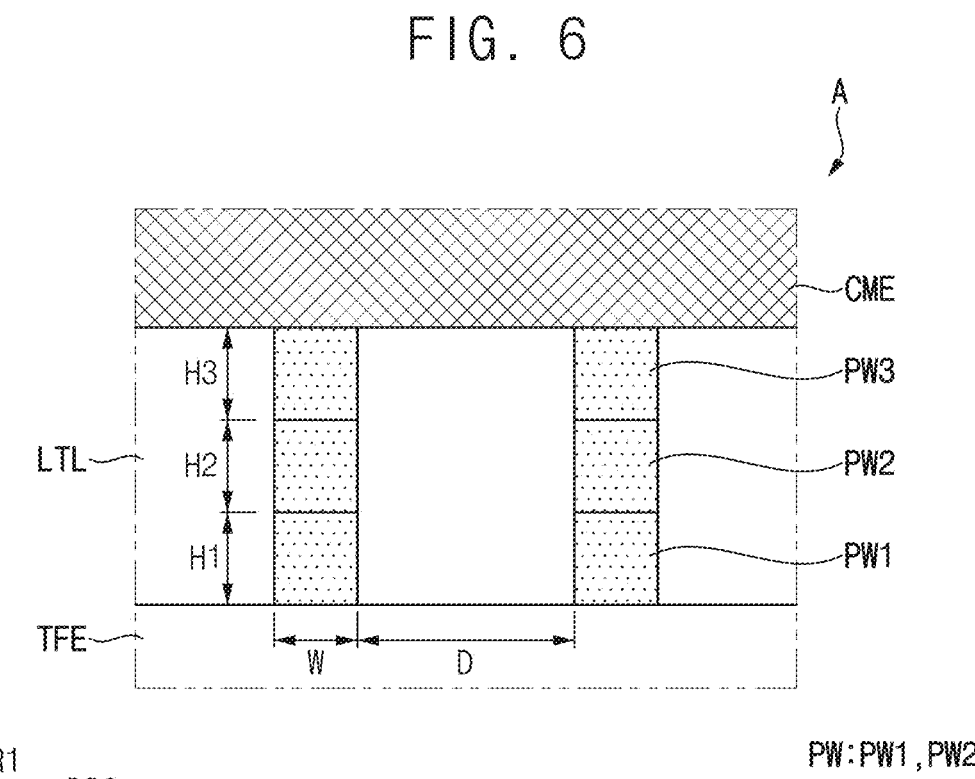
FIG. 6 is a cross-sectional view illustrating still another example of area A of FIG. 3A.

FIG. 4 is a cross-sectional view illustrating an example of area A of FIG. 3A. FIG. 5 is a cross-sectional view illustrating another example of area A of FIG. 3A. FIG. 6 is a cross-sectional view illustrating still another example of area A of FIG. 3A.

Referring to FIG. 4, in an embodiment, each of the plurality of light control patterns PW may have a single layer structure including MTO.

A height H of each of the plurality of light control patterns PW may be substantially the same as each other. In addition, a distance D between the plurality of light control patterns PW may be substantially the same as each other. That is, the plurality of light control patterns PW may be spaced apart from each other at equal intervals.

In an embodiment, for example, a value obtained by dividing the height H of each of the plurality of light control patterns PW by the distance D between the plurality of light control patterns PW may be greater than about 1.4. The height H of each of the plurality of light control patterns PW may be in a range of about 3 micrometers to about 50 micrometers. The distance D between the plurality of light control patterns PW may be about 20 micrometers or less.

In an embodiment, an angle θ between the encapsulation layer TFE and the plurality of light control patterns PW may be in a range of about 80 degrees to about 100 degrees. In an embodiment, for example, an angle θ formed between the encapsulation layer TFE and the plurality of light control patterns PW may be about 90 degrees.

A width W of each of the plurality of light control patterns PW may be about 1 micrometer or less. In an embodiment, for example, where each of the plurality of light control patterns PW includes an MTO, the width W of each of the plurality of light control patterns PW may be in a range of about 2000 angstroms to about 4000 angstroms. Alternatively, where each of the plurality of light control patterns PW includes MTO/Mo/MTO, the width W of each of the plurality of light control patterns PW may be in a range of about 7000 angstroms to about 10000 angstroms.

The viewing angle of the display device 100 may be adjusted or limited as the light emitted from the first, second, and third light emitting elements LED1, LED2, and LED3 passes through areas between the plurality of light control patterns PW. In an embodiment, for example, some of the light having a relatively wide viewing angle may be absorbed by the plurality of light control patterns PW. In such an embodiment, another part of the light having a relatively narrow viewing angle may pass through the light transmission layer LTL between the plurality of light control patterns PW. In an embodiment where the value obtained by dividing the height H of each of the plurality of light control patterns PW by the distance D between the plurality of light control patterns PW is greater than about 1.4, the viewing angle may be less than or equal to about 30 degrees. However, in a case where the value obtained by dividing the height H of each of the plurality of light control patterns PW by the distance D between the plurality of light control patterns PW is less than or equal to about 1.4, the viewing angle may not decrease.

In a case where the distance D between the plurality of light control patterns PW is greater than about 20 microm- eters, the viewing angle may not substantially decrease.

In a case where the height H of the plurality of light control patterns PW is smaller than about 3 micrometers, the viewing angle might not substantially decrease. In addition, in a case where the height H of the plurality of light control patterns PW is greater than about 50 micrometers, the plurality of light control patterns PW may not be easily formed.

Referring to FIG. 5, in an alternative embodiment, each of the plurality of light control patterns PW may have a two-layer structure including a first sub-partition wall PW1 and a second sub-partition wall PW2 disposed on the first sub-partition wall PW1.

The first sub-partition wall PW1 and the second sub-partition wall PW2 may include a same material as each other.

A first height H1 of the first sub-partition PW1 may be substantially the same as a second height H2 of the second sub-partition wall PW2. In addition, the distance D between the first sub-partition walls PW1 adjacent to each other may be substantially the same as the distance D between the second sub-partition walls PW2 adjacent to each other.

In an embodiment, a value obtained by dividing the sum of the first height H1 of the first sub-partition wall PW1 and the second height H2 of the second sub-partition wall PW2 by the distance D between the first sub-partition walls PW1 adjacent to each other may be greater than about 1.4. In an embodiment, for example, the sum of the first height H1 of the first sub-partition wall PW1 and the second height H2 of the second sub-partition wall PW2 may be in a range of about 3 micrometers to about 50 micrometers.

In an embodiment, the second sub-partition wall PW2 may overlap the first sub-partition wall PW1 in a plan view. In an alternative embodiment, for example, the second sub-partition wall PW2 does not overlap the first sub-partition wall PW1 in the plan view, and the distance between the second sub-partition wall PW2 and the first sub-partition wall PW1 in the second direction DR2 may be about 3 micrometers or less.

In an embodiment, the second sub-partition wall PW2 may contact the first sub-partition wall PW1. In an alternative embodiment, for example, the second sub-partition wall PW2 does not contact the first sub-partition wall PW1, and the distance between the second sub-partition PW2 and the first sub-partition PW1 in a thickness direction may be about 3 micrometers or less. The thickness direction may be a direction perpendicular to the plane defined by the first and second directions DR1 and DR2. In such an embodiment, a part of the light transmission layer LTL may be disposed between the first sub-partition wall PW1 and the second sub-partition wall PW2.

In a case where the distance between the second sub-partition wall PW2 and the first sub-partition wall PW1 in the thickness direction is greater than about 3 micrometers, light emitted from the first, second, and third light emitting elements LED1, LED2, and LED3 may pass through a part of the light transmitting layer LTL between the first sub-partition wall PW1 and the second sub-partition wall PW2. Due to this, the viewing angle of the display device 100 may not substantially decrease.

Referring to FIG. 6, in another alternative embodiment, each of the plurality of light control patterns PW may have a three-layer structure including a first sub-partition wall PW1, a second sub-partition wall PW2 disposed on the first sub-partition wall PW1, and a third sub-partition wall PW3 disposed on the second sub-partition wall PW2.

The first sub-partition wall PW1, the second sub-partition wall PW2, and the third sub-partition wall PW3 may include a same material as each other.

A value obtained by dividing the sum of a first height H1 of the first sub-partition wall PW1, a second height H2 of the second sub-partition wall PW2, and a third heigh H3 of the third sub-partition wall PW3 by the distance D between the plurality control patterns PW may be greater than about 1.4. In this case, since each of the plurality of light control patterns PW is substantially the same as the plurality of light control patterns PW described with reference to FIG. 5 except that each of the plurality of light control patterns PW has a three-layer structure, any repetitive detailed descriptions thereof will be omitted.

Since each of the plurality of light control patterns PW has a three-layer structure, the plurality of light control patterns PW may be more easily and precisely formed.

Referring back to FIGS. 3A and 3B, the light transmission layer LTL may be disposed between the plurality of light control patterns PW. In an embodiment, for example, the light transmission layer LTL may include a transparent organic material. The light transmission layer LTL may have a substantially flat upper surface.

In an embodiment, for example, the height of the light transmission layer LTL may be substantially the same as the height of each of the plurality of light control patterns PW. Alternatively, the height of the light transmission layer LTL may be greater than the height of each of the plurality of light control patterns PW. In such an embodiment, the light transmission layer LTL may entirely cover the plurality of light control patterns PW.

In an embodiment, a light diffusion layer may be disposed on the light transmission layer LTL and the plurality of light control patterns PW. The light diffusion layer is a layer that controls whether or not the light passed through the light transmission layer LTL is diffused and the degree of diffusion. The light diffusion layer may allow light to pass therethrough as it is to have a controlled viewing angle which is controlled by the light transmission layer LTL or nullify the controlled viewing angle controlled by the light transmission layer LTL. That is, the display device 100 may be switched between the first mode state having a relatively wide viewing angle and the second mode state having a relatively narrow viewing angle through a structural change of the light diffusion layer.

The light diffusion layer may include the solvent layer SL and the plurality of electrophoretic particles SP positioned inside (or dispersed in) the solvent layer SL.

The solvent layer SL may include a non-polar solvent. In an embodiment, for example, the solvent layer SL may include aromatic hydrocarbons, aliphatic hydrocarbons, halogenated hydrocarbons, phosphoric acid esters, carboxylic acid esters, isopropylbiphenyl, isoamylbiphenyl, chlorinated paraffin, or the like.

Examples of the aromatic hydrocarbons may include benzene, toluene, xylene, or the like. Examples of the aliphatic hydrocarbons may include hexane, dodecylbenzene, cyclohexane, paraffinic hydrocarbons, or the like. Examples of the halogenated hydrocarbons may include chloroform, trichloroethylene, or the like. Examples of the phosphoric acid esters may include tricresyl phosphate, trioctyl phosphate, octyldiphenyl phosphate, or the like. Examples of the phthalic acid esters may include dibutyl phthalate, dioctyl phthalate, or the like. Examples of the carboxylic acid esters may include butyl oleate, diethylene glycol dibenzoate, dioctyl sebacinate, or the like. Each of these may be used alone or in combination with each other.

The plurality of electrophoretic particles SP may scatter or block light incident on the light diffusion layer. In an embodiment, each of the plurality of electrophoretic particles SP may be a transparent light scattering particle.

In an embodiment, for example, each of the plurality of electrophoretic particles SP may include a hollow particle, a charge control agent, a binder resin, and a surfactant. The hollow particle may be a particle having an empty inside. The hollow particle is particle that function to scatter light, and include air in the hollow part to further increase light scattering. In an embodiment, for example, the hollow particle may include an inorganic particle, an organic particle, or an organic-inorganic composite particle. Examples of the inorganic particle may include silica ($SiO_2$), alumina ($Al_2O_3$), titania ($TiO_2$), zirconia ($ZrO_2$), ceria ($CeO_2$), vanadia ($V_2O_5$), or the like. These may be used alone or in combination with each other. Examples of the organic particle may include polystyrene or the like.

The charge control agent may be bonded to the hollow particle and have a functional group such as a carboxyl group at an end thereof so that the plurality of electrophoretic particles SP are charged. That is, the plurality of electrophoretic particles SP may become charged particles by the charge control agent. The charge control agent may be appropriately selected based on the desired charge to be imparted to the charged particles.

The binder resin may bind the hollow particle and the charge control agent internally and externally bind the surfactant. The surfactant can prevent aggregation due to interaction between heterogeneous particles having different polarities from each other.

The common electrode CME may be disposed between the light transmission layer LTL and the light diffusion layer. The common electrode CME may be disposed in a whole surface of the display area DA. The common electrode CME may include a transparent conductive material. In an embodiment, for example, the common electrode CME may include indium tin oxide (ITO), aluminum doped zinc oxide (AZO), fluorine doped tin oxide (FTO), silver-nanowire (AgNW), or the like. These may be used alone or in combination with each other. However, embodiments of the disclosure are not limited thereto.

The second substrate SUB2 may be disposed on the light diffusion layer. The second substrate SUB2 may include a transparent material. In an embodiment, for example, the second substrate SUB2 may include glass or plastic.

The light blocking layer BL may be disposed under the second substrate SUB2. The light blocking layer BL may overlap the non-light emitting area BA. An opening OP exposing at least a part of the second substrate SUB2 may be defined in the light blocking layer BL. The opening OP may overlap a light emitting area (e.g., the first, second, and third light emitting areas EA1, EA2, and EA3 of FIG. 2). The light blocking layer BL may block light incident thereto. In an embodiment, for example, the light blocking layer BL may include an inorganic material and/or an organic material including a light blocking material such as black pigment, black dye, or the like.

The first control electrode CTE1 may be disposed under the light blocking layer BL. The first control electrode CTE1 may overlap the non-light emitting area BA. In an embodiment, the first control electrode CTE1 may directly contact one surface of the light blocking layer BL facing the first substrate SUB1. The first control electrode CTE1 may include a transparent conductive material. In an embodiment, for example, the first control electrode CTE1 may include indium tin oxide (ITO), aluminum doped zinc oxide (AZO), fluorine doped tin oxide (FTO), silver-nanowire (AgNW), or the like. These may be used alone or in combination with each other. However, embodiments of the disclosure are not limited thereto.

Hereinafter, the first mode state implementing a wide viewing angle and the second mode state implementing a narrow viewing angle will be described.

In an embodiment, in the first mode state as shown in FIG. 3B, the plurality of electrophoretic particles SP may be dispersed in the solvent layer SL. In the first mode state, no voltage may be applied to the common electrode CME and the first control electrode CTE1.

In an embodiment, for example, a first light L1 emitted from the first light emitting element LED1 and passing areas between the plurality of light control patterns PW may collide with the plurality of electrophoretic particles SP and may be scattered. A second light L2 emitted from the second light emitting element LED2 and passing areas between the plurality of light control patterns PW may collide with the plurality of electrophoretic particles SP and may be scattered. In addition, a third light L3 emitted from the third light emitting element LED3 and passing areas between the plurality of light control patterns PW may collide with the plurality of electrophoretic particles SP and may be scattered.

That is, in the first mode state, since the light passed through areas between the plurality of light control patterns PW and having a controlled viewing angle is scattered by the plurality of electrophoretic particles SP, the viewing angle control effect by the plurality of light control patterns PW may be nullified.

In such an embodiment, in the second mode state as shown in FIG. 3B, a voltage may be applied to each of the common electrode CME and the first control electrode CTE1. Specifically, a first voltage may be applied to the common electrode CME, and a second voltage may be applied to the first control electrode CTE1. The first voltage and the second voltage may have different magnitudes or voltages levels from each other. Accordingly, an electric field may be formed or generated between the common electrode CME and the first control electrode CTE1, and the plurality of electrophoretic particles SP, which are charged particles having electric charges, may move inside the solvent layer SL by the Coulomb force.

In an embodiment where the plurality of electrophoretic particles SP are positively charged, the first voltage may be a positive voltage and the second voltage may be a negative voltage. In such an embodiment, for example, the first voltage may be about +6 volts (V) and the second voltage may be about −4 V. Alternatively, where the plurality of electrophoretic particles SP are positively charged, each of the first voltage and the second voltage may be a positive voltage, and the second voltage may be lower than the first voltage. In such an embodiment, for example, the first voltage may be about +6 V and the second voltage may be about +4 V.

In an embodiment where the plurality of electrophoretic particles SP are negatively charged, the first voltage may be a negative voltage and the second voltage may be a positive voltage. In such an embodiment, for example, the first voltage may be about −6 V and the second voltage may be about +4 V. Alternatively, where the plurality of electrophoretic particles SP are negatively charged, each of the first voltage and the second voltage may be a negative voltage, and the second voltage may be lower than the first voltage. In such an embodiment, for example, the first voltage may be about −6 V, and the second voltage may be about −4 V.

As voltages having different magnitudes are applied to each of the common electrode CME and the first control electrode CTE1, respectively, the plurality of electrophoretic particles SP may move into a space between the common electrode CME and the first control electrode CTE1. That is, the plurality of electrophoretic particles SP may move in a horizontal direction of the first substrate SUB1.

In an embodiment, for example, the first light L1 emitted from the first light emitting element LED1 and passing areas between the plurality of light control patterns PW may be scattered by the plurality of electrophoretic particles SP and the scattered first light L1 may be blocked by the light blocking layer BL. The second light L2 emitted from the second light emitting element LED2 and passing areas between the plurality of light control patterns PW may be scattered by the plurality of electrophoretic particles SP and the scattered second light L2 may be blocked by the light blocking layer BL. In addition, the third light L3 emitted from the third light emitting element LED3 and passing areas between the plurality of light control patterns PW may be scattered by the plurality of electrophoretic particles SP and the scattered third light L3 may be blocked by the light blocking layer BL.

That is, in the second mode state, the light passed through areas between the plurality of light control patterns PW and having a controlled viewing angle passes through the light diffusion layer as it is or is scattered and blocked by the plurality of electrophoretic particles SP and the light blocking layer BL, the viewing angle controlled by the plurality of light control patterns PW may be emitted to an outside as it is.

Figure 7:
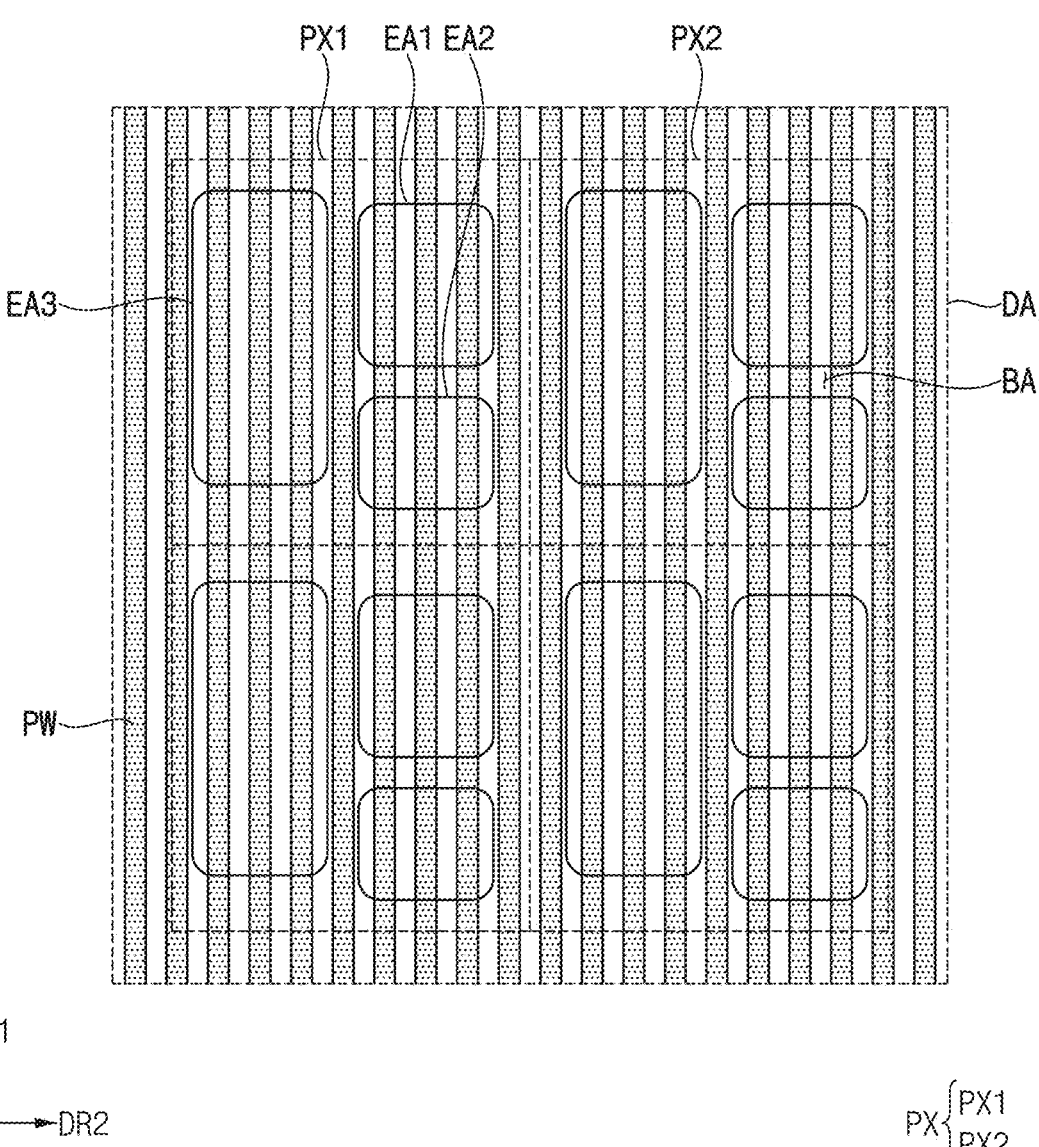
FIG. 7 is a plan view illustrating a plurality of light control patterns of FIGS. 3A and 3B.

FIG. 7 is a plan view illustrating a plurality of light control patterns of FIGS. 3A and 3B.

Referring to FIG. 7, the plurality of light control patterns PW may be arranged side by side with each other in a plan view. In an embodiment, for example, the plurality of light control patterns PW may be disposed to be spaced apart from each other in the second direction DR2. In addition, each of the plurality of light control patterns PW may extend in the first direction DR1. In this case, a user may view the display device 100 in the second direction DR2 or in a direction opposite to the second direction DR2. However, embodiments of the disclosure are not limited thereto.

In an embodiment, for example, the plurality of light control patterns PW may be disposed to overlap the first pixel PX1 or the second pixel PX2. Alternatively, the plurality of light control patterns PW may include a plurality of first light control patterns disposed to be spaced apart from each other in the first direction DR1 and a plurality of second light control patterns disposed to be spaced apart from each other in the second direction DR2. Alternatively, where each of the first, second, and third light emitting areas EA1, EA2, and EA3 is divided into two sub-light emitting areas, each of the plurality of light control patterns PW may overlap only one sub-light emitting area among the sub-light emitting areas.

Figure 8:
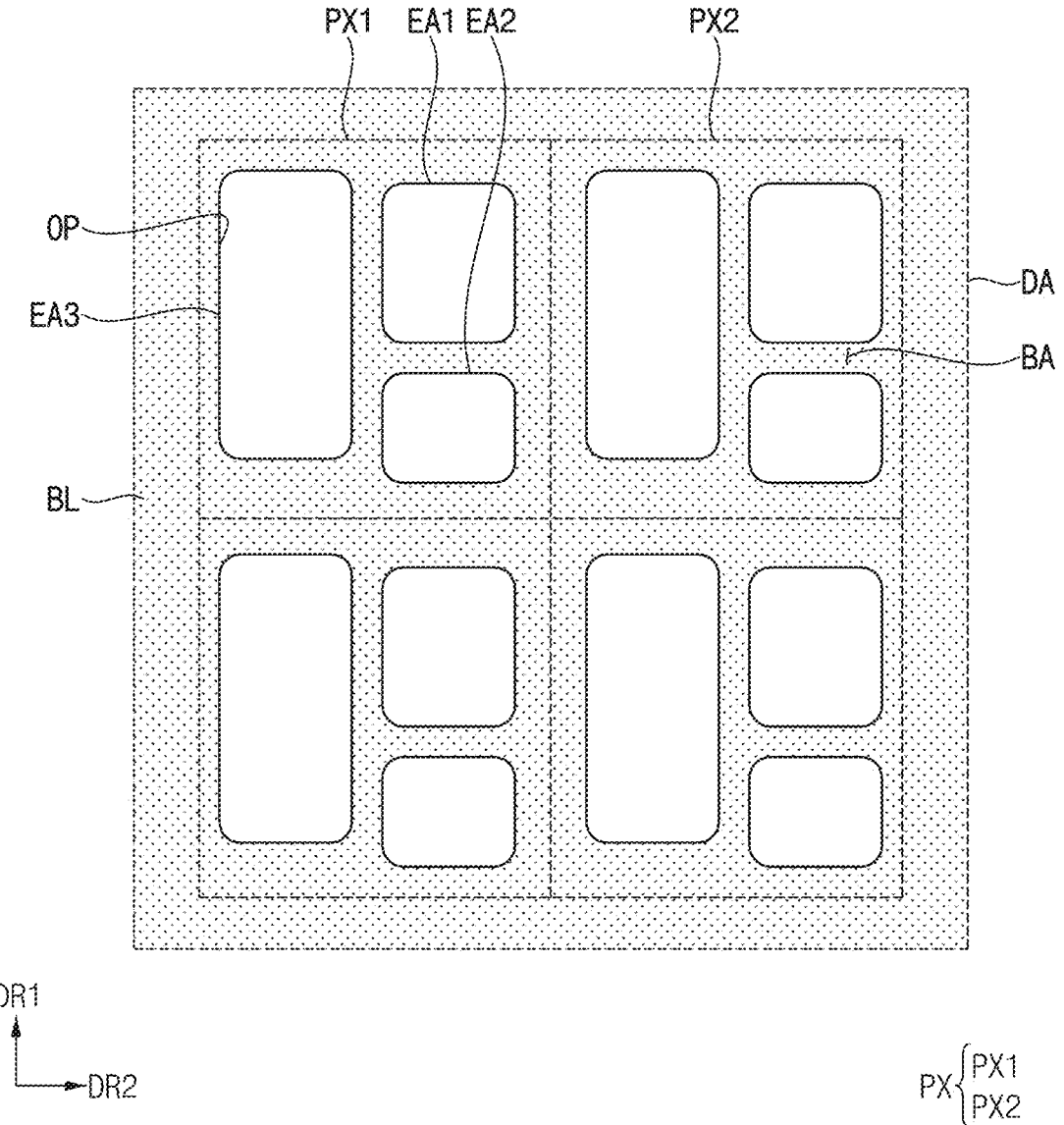
FIG. 8 is a plan view illustrating a light blocking layer of FIGS. 3A and 3B.

FIG. 8 is a plan view illustrating a light blocking layer of FIGS. 3A and 3B.

Referring to FIG. 8, the light blocking layer BL may be disposed in the non-light emitting area BA. That is, the light blocking layer BL may overlap the non-light emitting area BA and may not overlap the first, second, and third light emitting areas EA1, EA2, and EA3. In addition, the opening OP overlapping the first, second, and third light emitting areas EA1, EA2, and EA3 may be defined in the light blocking layer BL.

Figure 9:
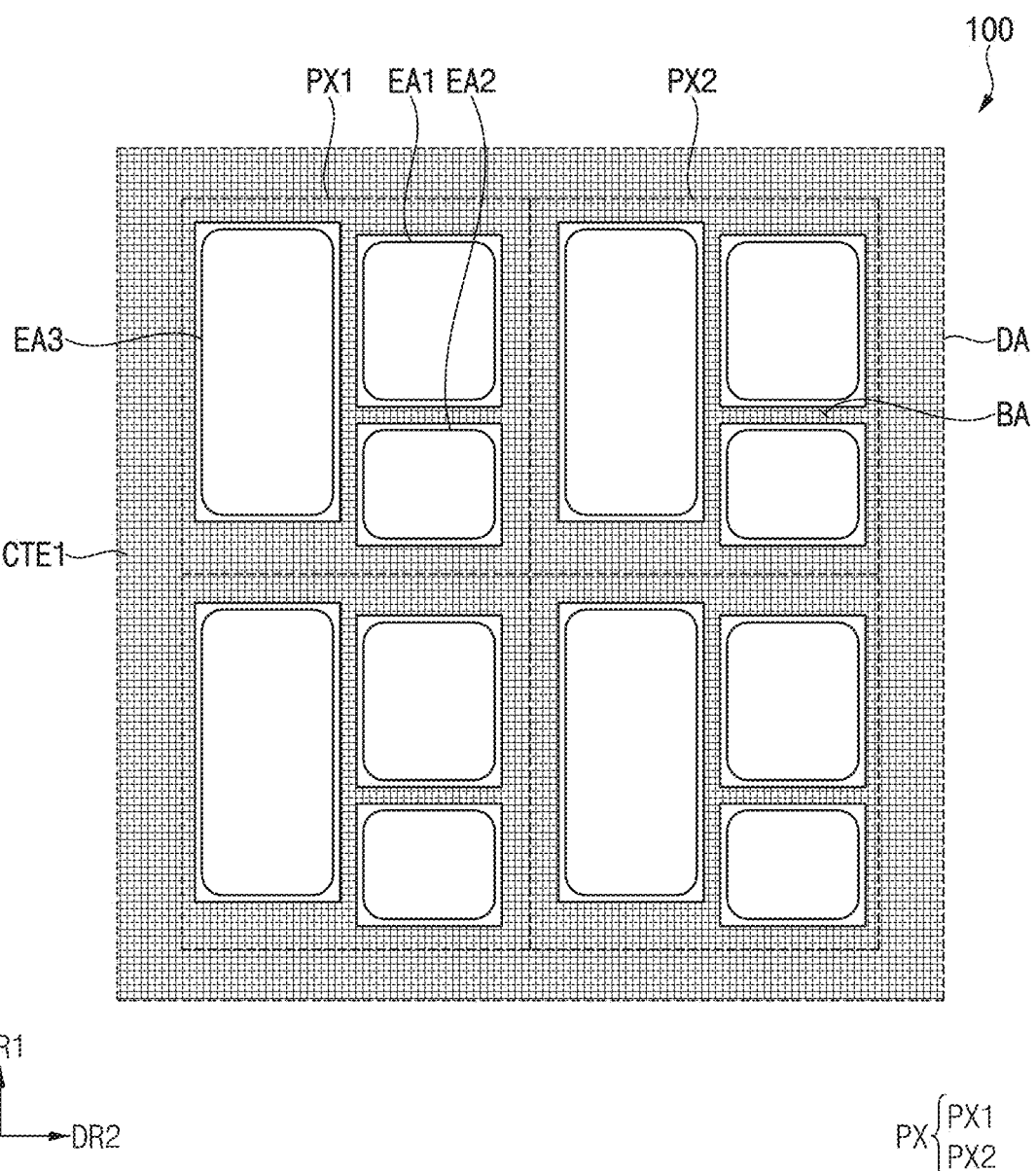
FIG. 9 is a plan view illustrating a first control electrode of FIGS. 3A and 3B.

FIG. 9 is a plan view illustrating a first control electrode of FIGS. 3A and 3B.

Referring to FIGS. 8 and 9, the first control electrode CTE1 may be disposed in the non-light emitting area BA. That is, the first control electrode CTE1 may overlap the non-light emitting area BA and might not overlap the first, second, and third light emitting areas EA1, EA2, and EA3.

In an embodiment, the planar shape of the first control electrode CTE1 may be substantially the same as the planar shape of the light blocking layer BL. In an embodiment, for example, the size of the first control electrode CTE1 may be smaller than the size of the light blocking layer BL. However, embodiments of the disclosure are not limited thereto, and the first control electrode CTE1 may have various planar shapes as long as the first control electrode CTE1 overlaps at least a part of the non-light emitting area BA.

FIGS. 10, 11, 12, and 13 are cross-sectional views illustrating an embodiment of a method for manufacturing a plurality of light control patterns of FIGS. 3A and 3B.

Figure 10:
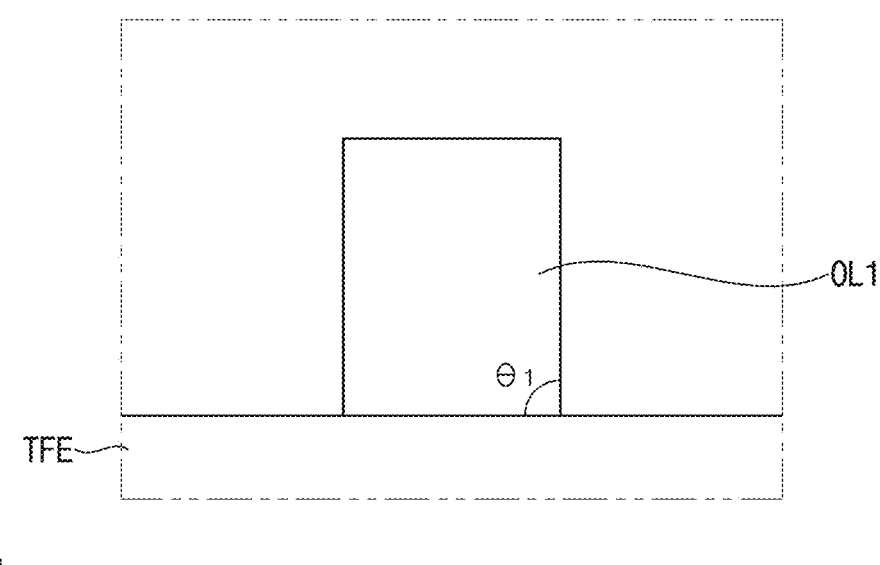
FIGS. 10, 11, 12, and 13 are cross-sectional views illustrating an embodiment of a method for manufacturing a plurality of light control patterns of FIGS. 3A and 3B.

Referring to FIG. 10, in an embodiment of a method for manufacturing a plurality of light control patterns, a first organic layer OL1 may be provided or formed on the encapsulation layer TFE. The first organic layer OL1 may include a transparent organic material. The first organic layer OL1 may include a plurality of organic patterns spaced apart from each other in the second direction DR2.

The first organic layer OL1 may have a substantially rectangular cross-sectional shape. That is, an angle $\theta 1$ between the encapsulation layer TFE and the first organic layer OL1 may be about 90 degrees. However, within an error that may occur due to a manufacturing process in which the first organic layer OL1 is formed, the angle θ1 formed between the encapsulation layer TFE and the first organic layer OL1 may be in a range of about 80 degrees to about 90 degrees.

Figure 11:
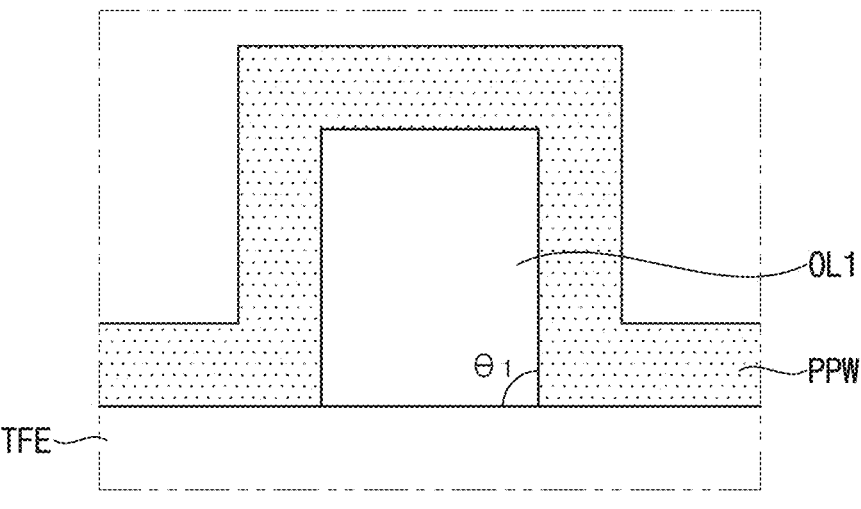
Figure 11:
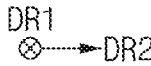

Further referring to FIG. 11, a preliminary light control pattern PPW may be provided or formed on the encapsulation layer TFE and the first organic layer OL1. The preliminary light control pattern PPW may be formed along the profile of the first organic layer OL1. In an embodiment, for example, the preliminary light control pattern PPW may include an MTO. In an embodiment, the preliminary light control pattern PPW may include MTO/Mo, MTO/Cu, MTO/Al, MTO/Mo/MTO, MTO/Cu/MTO, MTO/Al/MTO, or the like. These may be used alone or in combination with each other.

Figure 12:
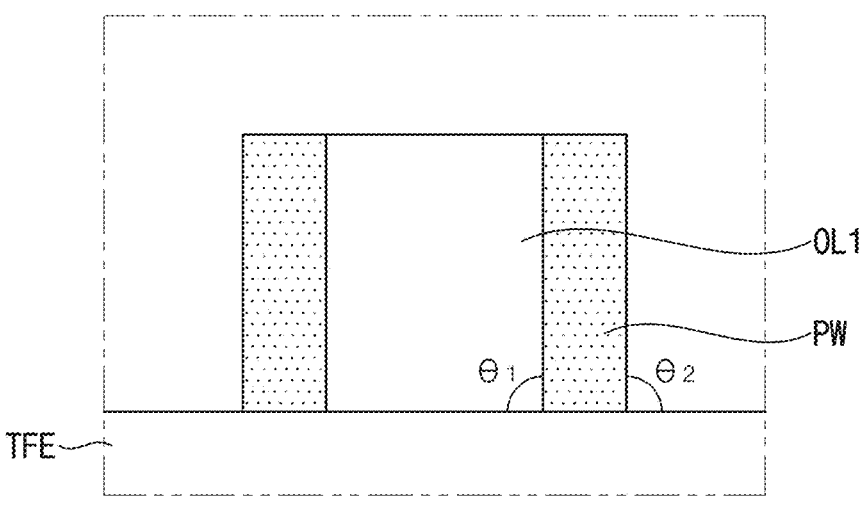

Further referring to FIG. 12, a part of the preliminary light control pattern PPW may be removed. Specifically, the part of the preliminary light control pattern PPW may be anisotropically dry etched. By removing the part of the preliminary light control pattern PPW, the plurality of light control patterns PW may be formed. The plurality of light control patterns PW may be disposed on a side surface of the first organic layer OL1. The height of each of the plurality of light control patterns PW may be substantially the same as the height of the first organic layer OL1.

Each of the plurality of light control patterns PW may have a substantially rectangular cross-sectional shape. That is, an angle θ2 formed between the encapsulation layer TFE and each of the plurality of light control patterns PW may be about 90 degrees.

In an embodiment, the width of each of the plurality of light control patterns PW may increase in a thickness direction as being away from the encapsulation layer TFE. In an embodiment where the angle θ1 formed by the encapsulation layer TFE and the first organic layer OL1 is about 80 degrees, the angle θ2 formed by the encapsulation layer TFE and the plurality of light control patterns PW may be about 90 degrees. However, within an error that may occur due to the manufacturing process in which the first organic layer OL1 and the plurality of light control patterns PW are formed, the angle θ2 formed by the encapsulation layer TFE and the plurality of light control patterns PW may be in a range of about 80 degrees to about 100 degrees.

Figure 13:
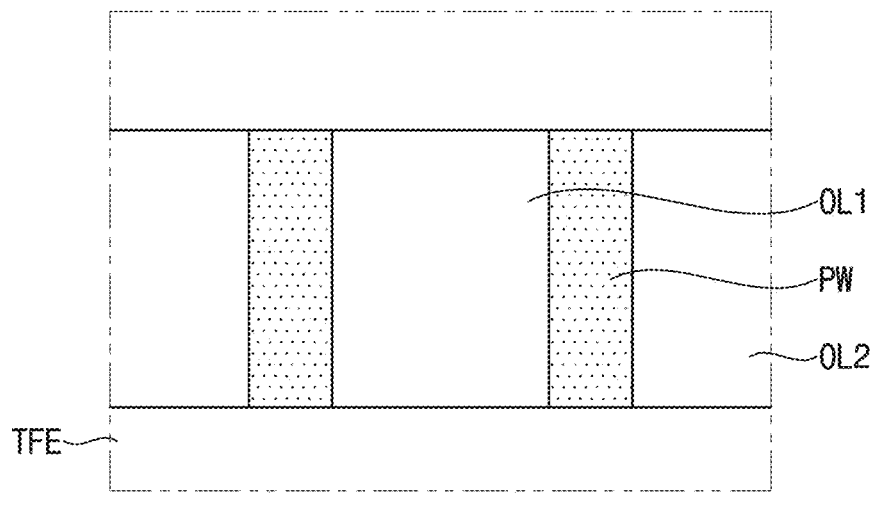

Referring to FIG. 13, a second organic layer OL2 may be provided or formed between the plurality of light control patterns PW in which the first organic layer OL1 is not formed. The second organic layer OL2 may include a transparent organic material. The second organic layer OL2 may include substantially a same material as the first organic layer OL1. In an embodiment, for example, the height of the second organic layer OL2 may be substantially the same as the height of each of the plurality of light control patterns PW. Alternatively, the height of the second organic layer OL2 may be greater than the height of each of the plurality of light control patterns PW. A combination of the first organic layer OL1 and the second organic layer OL2 may be defined as the light transmitting layer LTL shown in FIGS. 3A and 3B.

FIGS. 14, 15, 16, 17, 18, and 19 are cross-sectional views illustrating an alternative embodiment of a method for manufacturing a plurality of light control patterns of FIGS. 3A and 3B.

Figure 14:
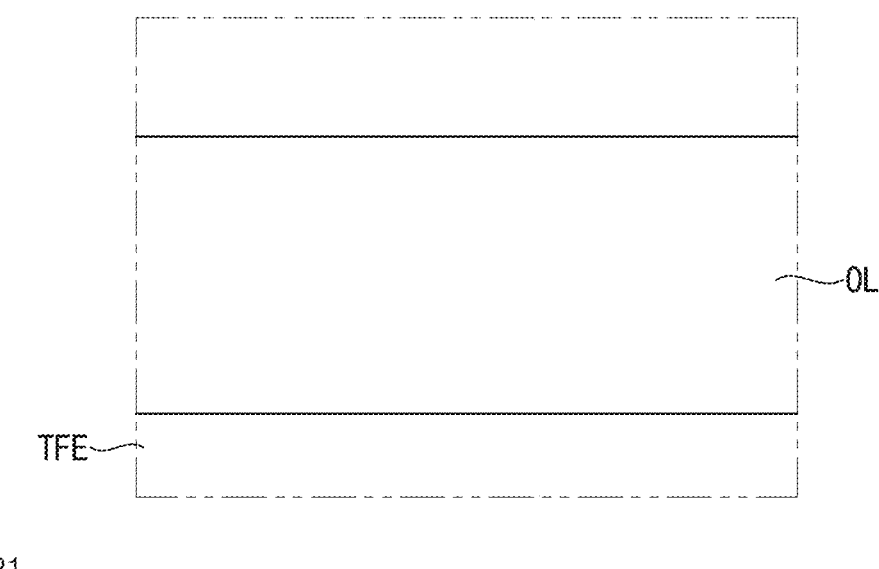
FIGS. 14, 15, 16, 17, 18, and 19 are cross-sectional views illustrating an alternative embodiment of a method for manufacturing a plurality of light control patterns of FIGS. 3A and 3B.

Referring to FIG. 14, in an embodiment of a method for manufacturing a plurality of light control patterns, an organic layer OL may be provided or formed on the encapsulation layer TFE. The organic layer OL may include a transparent organic material.

Figure 15:
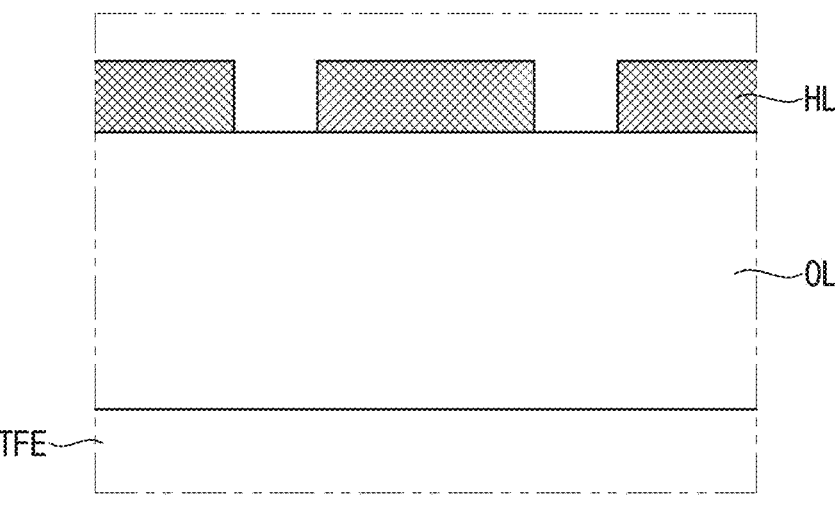
Figure 15:

Further referring to FIG. 15, a hard mask layer HL may be provided or formed on the organic layer OL. The hard mask layer HL may expose at least a part of an upper surface of the organic layer OL. In an embodiment, for example, the hard mask layer HL may include a transparent conductive material.

Figure 16:
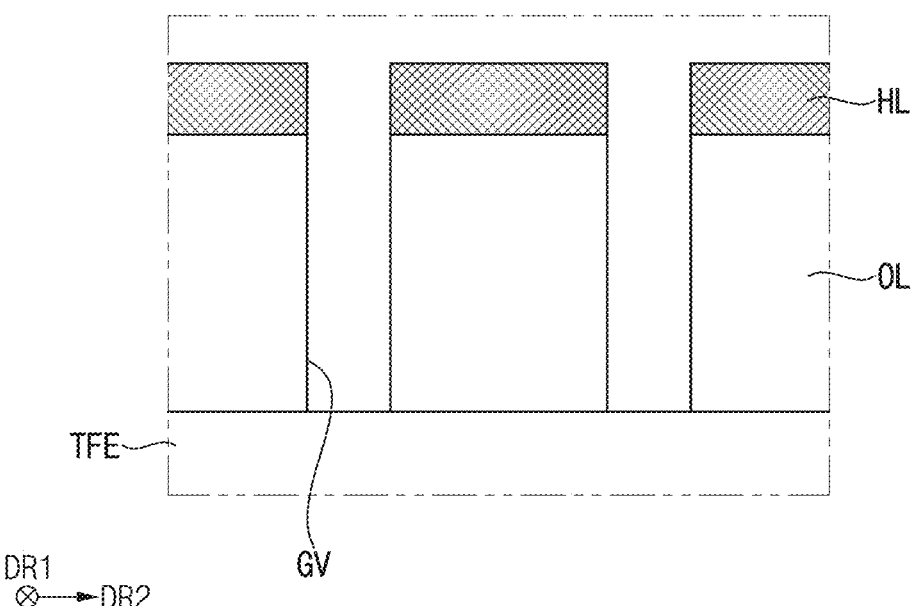

Further referring to FIG. 16, a part of the organic layer OL that does not overlap the hard mask layer HL may be removed. Specifically, the part of the organic layer OL that does not overlap the hard mask layer HL may be anisotropically dry etched. Accordingly, a groove GV exposing a part of the upper surface of the encapsulation layer TFE may be formed in the organic layer OL.

Figure 17:
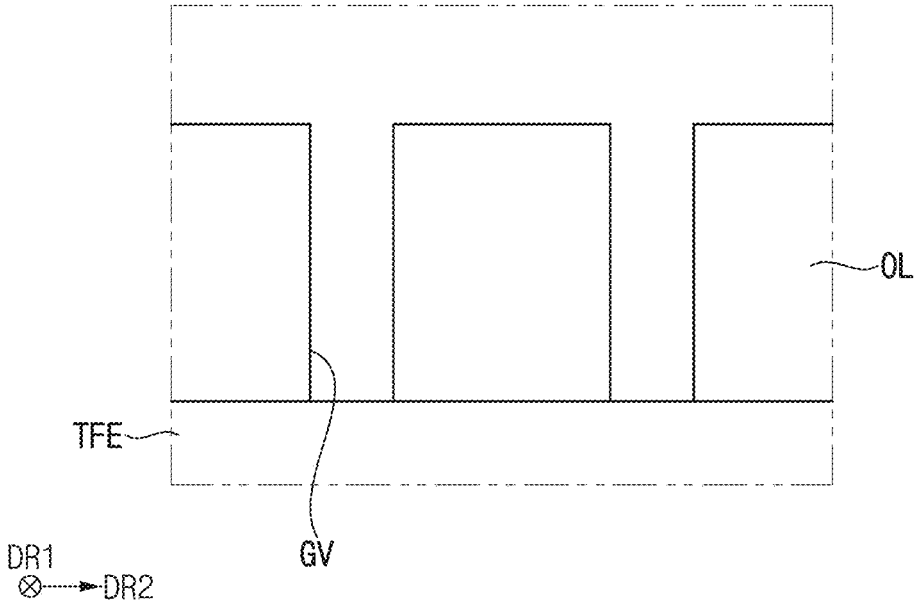

Referring further to FIG. 17, after the groove GV is formed, the hard mask layer HL may be removed. Alternatively, after the groove GV is formed, the hard mask layer HL may not be removed.

Figure 18:
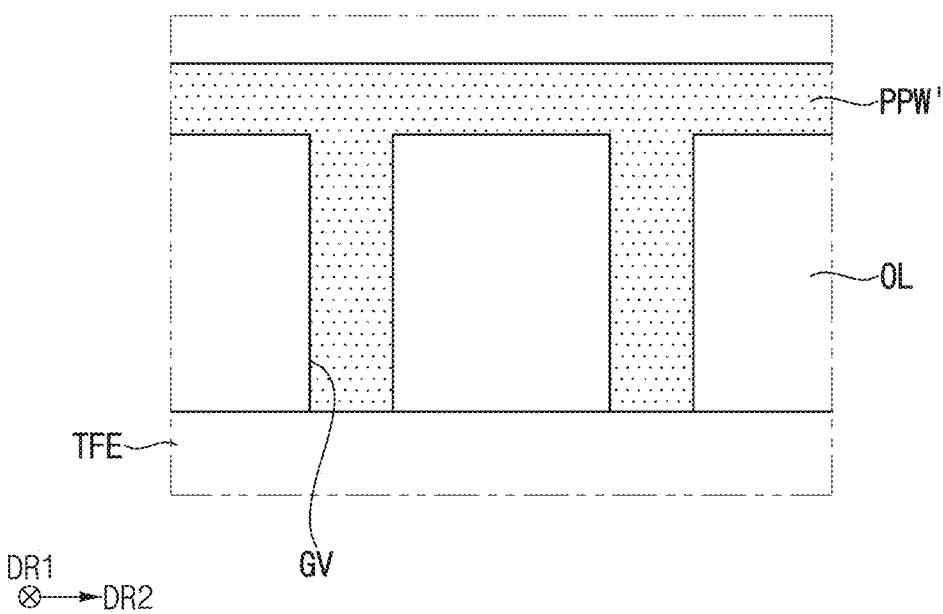

Referring further to FIG. 18, a preliminary light control pattern PPW' may be formed on the organic layer OL. The preliminary light control pattern PPW' may fill the groove GV. In an embodiment, for example, the preliminary light control pattern PPW' may include an organic material including a light blocking material such as black pigment, black dye, or the like.

Figure 19:
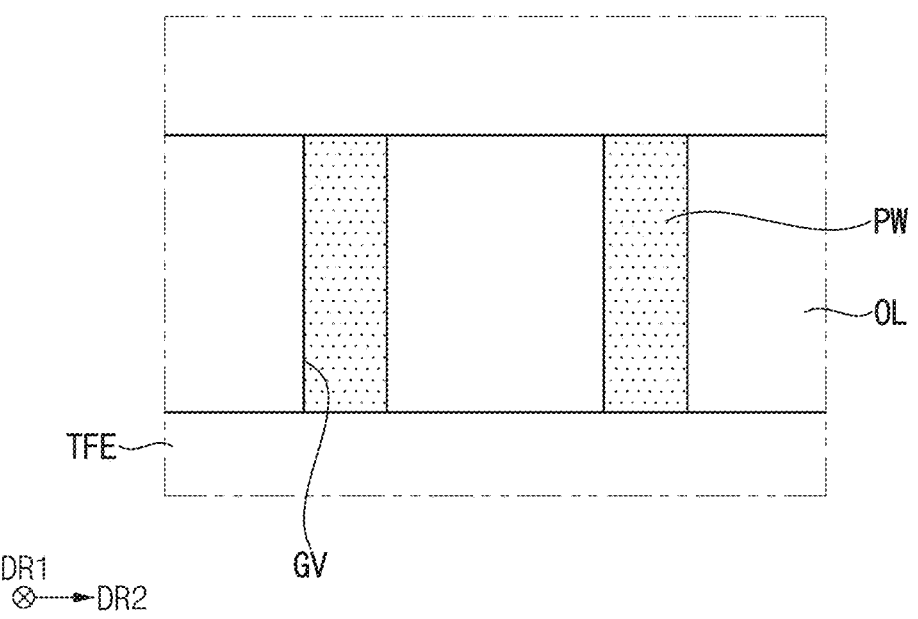

Further referring to FIG. 19, a part of the preliminary light control pattern PPW' may be removed. Specifically, the part of the preliminary light control pattern PPW' may be removed by a chemical mechanical polishing (CMP) process. Accordingly, the plurality of light control patterns PW filling the groove GV may be formed. The organic layer OL may correspond to the light transmission layer LTL shown in FIGS. 3A and 3B.

Figure 20A:
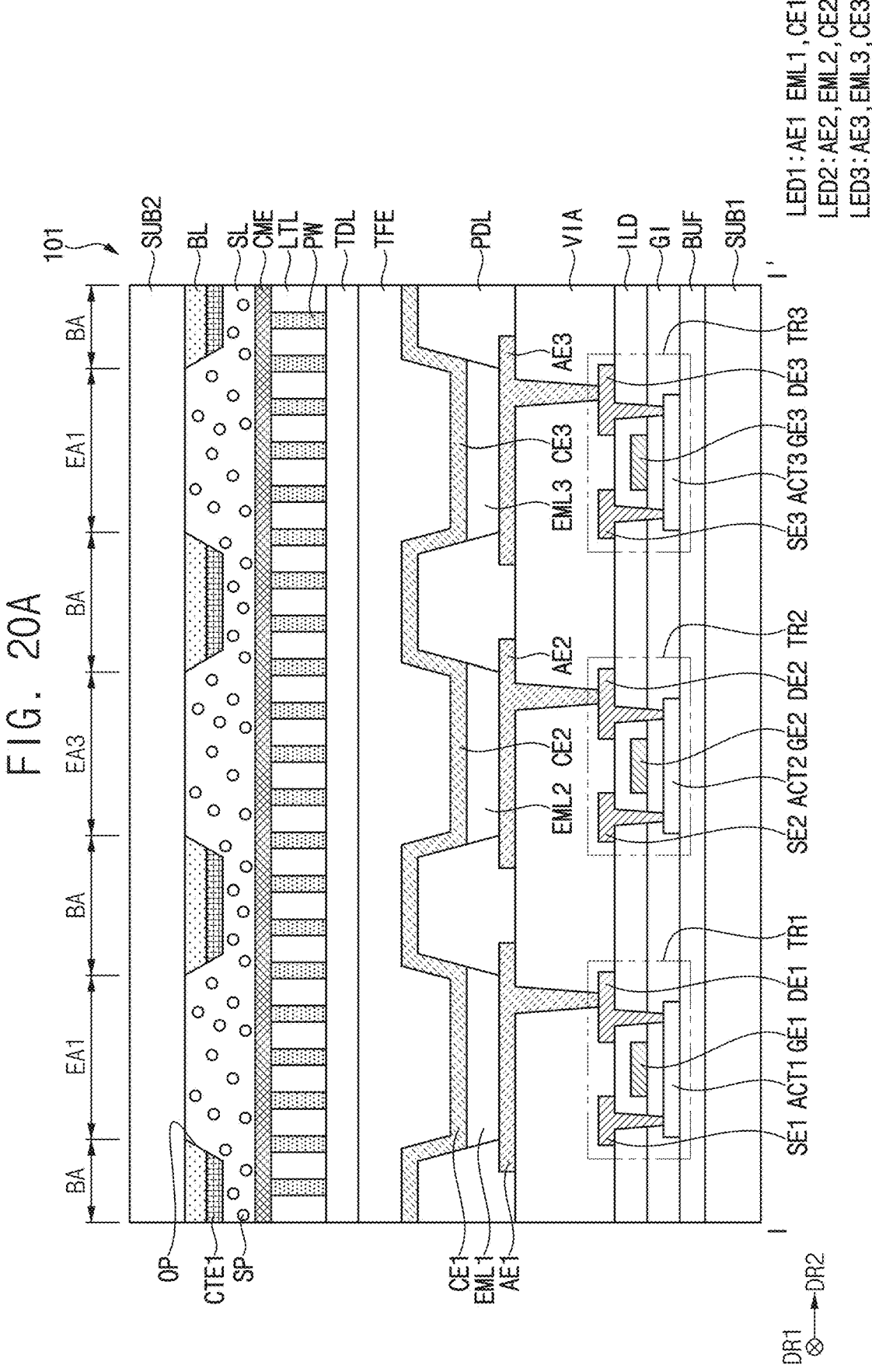
FIGS. 20A and 20B are cross-sectional views illustrating a display device according to an alternative embodiment of the disclosure.
Figure 20B:
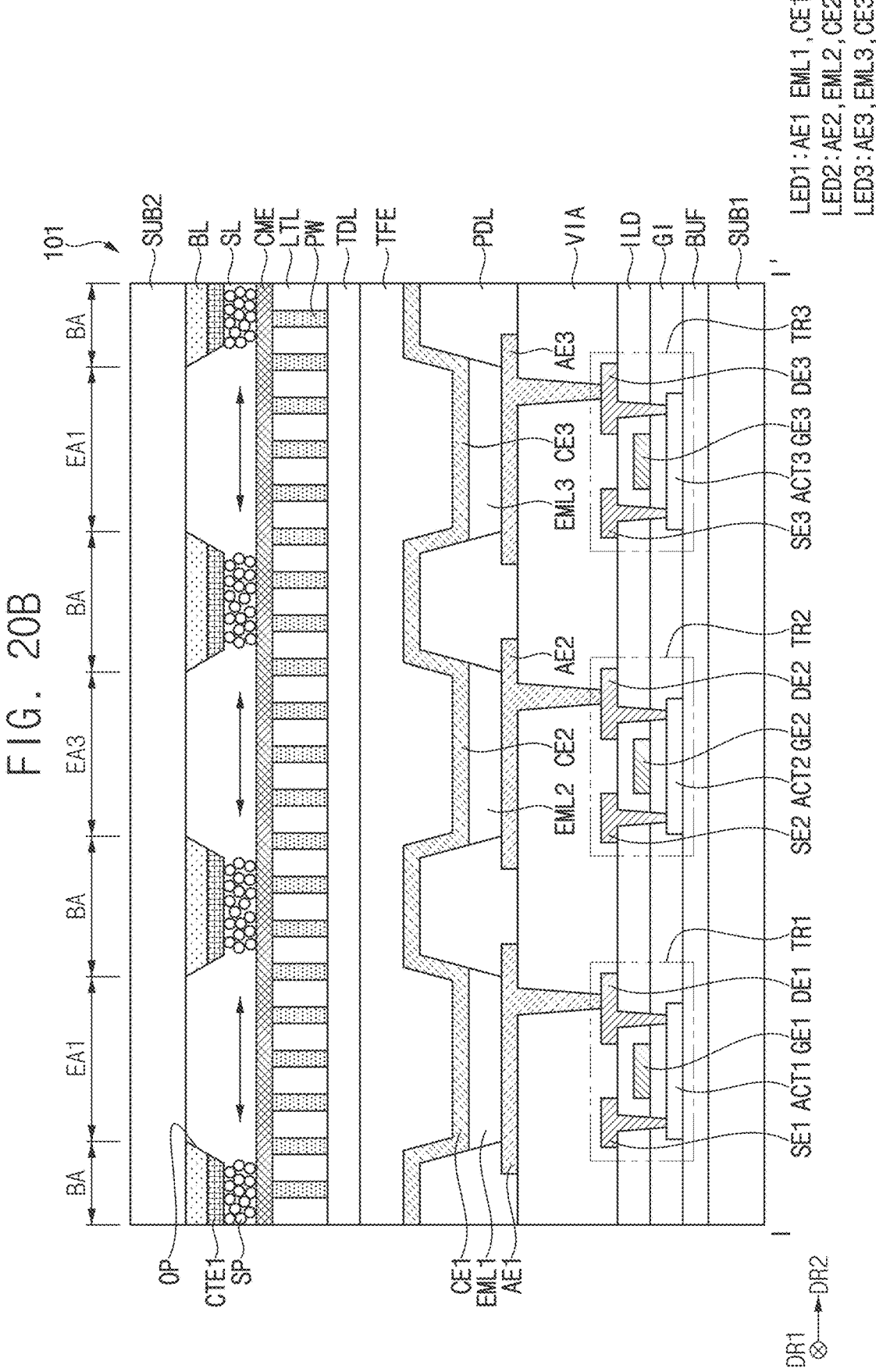

FIGS. 20A and 20B are cross-sectional views illustrating a display device according to an alternative embodiment of the disclosure. Particularly, FIG. 20A may show a display device 101 in a first mode state, and FIG. 20B may show the display device 101 in a second mode state. Here, the first mode state may mean a mode for implementing a wide viewing angle, and the second mode state may mean a mode for implementing a narrow viewing angle.

Referring to FIGS. 20A and 20B, the display device 101 according to an embodiment of the disclosure may include a first substrate SUB1, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements LED1, LED2, and LED3, an encapsulation layer TFE, a touch sensing layer TDL, a light transmission layer LTL, a plurality of light control patterns PW, a common electrode CME, a solvent layer SL, a plurality of electrophoretic particles SP, a first control electrode CTE1, a light blocking layer BL, and a second substrate SUB2.

The display device 101 described with reference to FIGS. 20A and 20B may be substantially the same as or similar to the display device 100 described with reference to FIGS. 3A and 3B except that the display device 101 further includes the touch sensing layer TDL. In the following, any repetitive detailed descriptions of the same or like elements as those described above will be omitted or simplified.

In an embodiment, the touch sensing layer TDL may be disposed between the encapsulation layer TFE and the light transmission layer LTL. The touch sensing layer TDL may sense a user's touch. In an embodiment, for example, the touch sensing layer TDL may include a first touch electrode, and a second touch electrode disposed on the first touch electrode and connected to the first touch electrode. In an alternative embodiment, the touch sensing layer TDL may be disposed between the light transmission layer LTL and the common electrode CME.

Since features of the first mode state implementing a wide viewing angle and the first mode state implementing a narrow viewing angle are substantially the same as those described with reference to FIGS. 3A and 3B, any repetitive detailed descriptions thereof will be omitted.

Figure 21A:
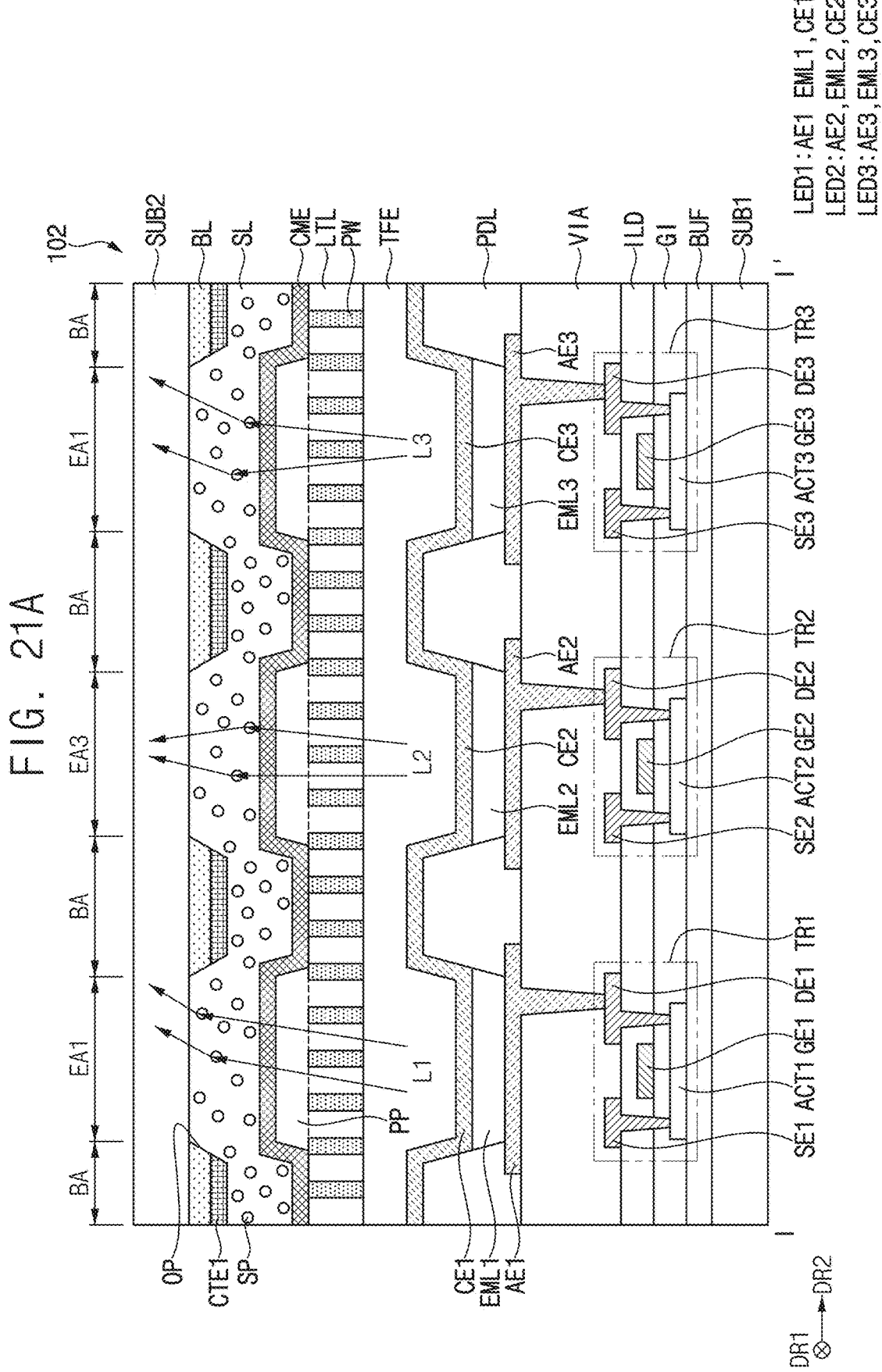
FIGS. 21A and 21B are cross-sectional views illustrating a display device according to another alternative embodiment of the disclosure.
Figure 21B:
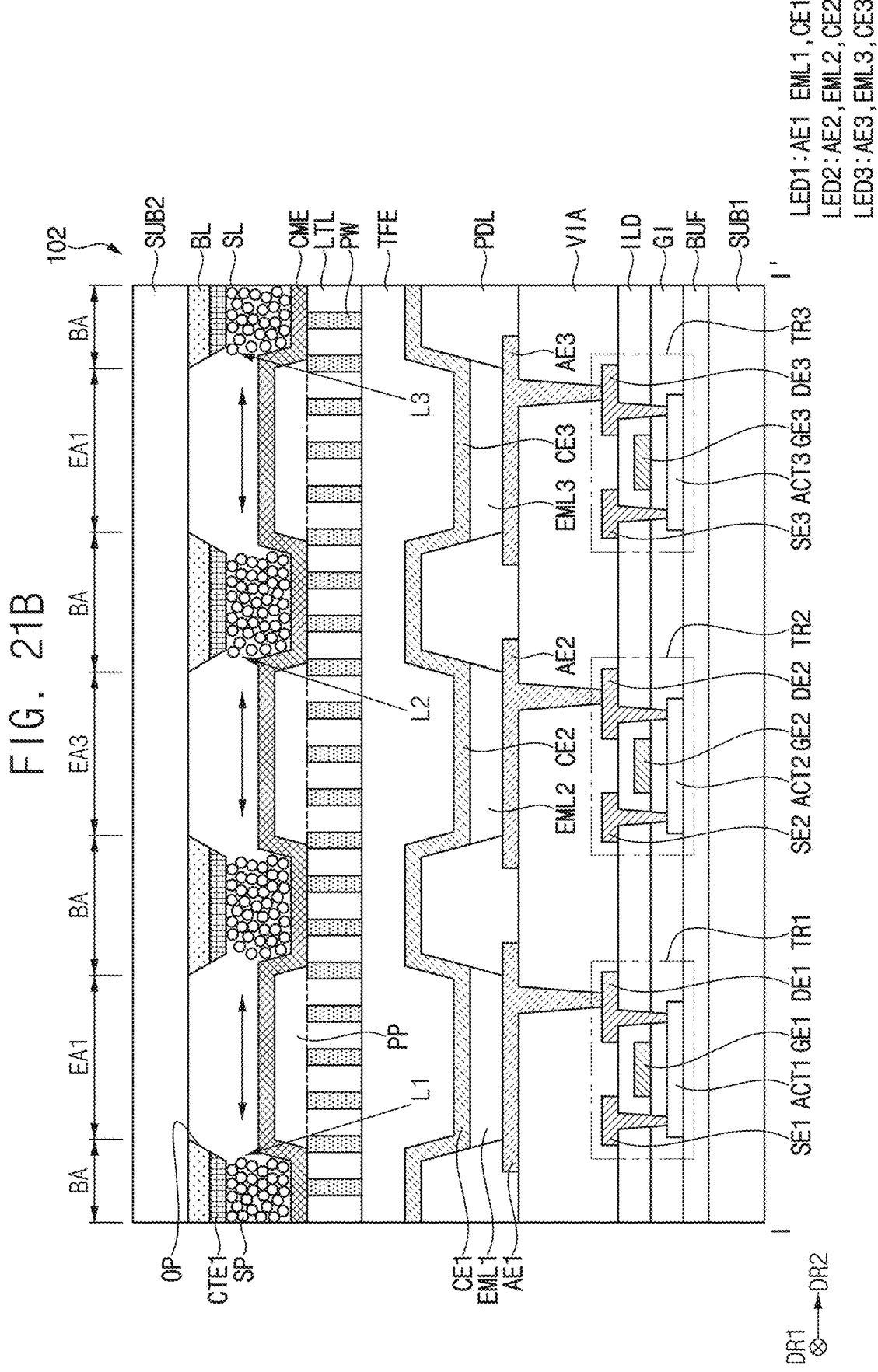

FIGS. 21A and 21B are cross-sectional views illustrating a display device according to another alternative embodiment of the disclosure. Particularly, FIG. 21A may show a display device 102 in a first mode state, and FIG. 21B may show the display device 102 in a second mode state. Here, the first mode state may mean a mode for implementing a wide viewing angle, and the second mode state may mean a mode for implementing a narrow viewing angle.

Referring to FIGS. 21A and 21B, the display device 102 according to an embodiment of the disclosure may include a first substrate SUB1, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements LED1, LED2, and LED3, an encapsulation layer TFE, a light transmission layer LTL, a plurality of light control patterns PW, a common electrode CME, a solvent layer SL, a plurality of electrophoretic particles SP, a first control electrode CTE1, a light blocking layer BL, and a second substrate SUB2.

The display device 102 described with reference to FIGS. 21A and 21B may be substantially the same as or similar to the display device 100 described with reference to FIGS. 3A and 3B except for the shape of the light transmission layer LTL. In the following, any repetitive detailed descriptions of the same or like elements as those described above will be omitted or simplified.

In an embodiment, the light transmission layer LTL may include a protrusion part PP protruding toward the common electrode CME from an upper surface of the light transmission layer LTL. That is, in the light transmission layer LTL, a step structure may be defined between the non-light emitting area BA and the light emitting area (e.g., the first, second, and third light emitting areas EA1, EA2, and EA3 of FIG. 2). In such an embodiment, a height of a part of the light transmitting layer LTL overlapping the light emitting area may be greater than a height of a part of the light transmitting layer LTL overlapping the non-emitting area BA. In such an embodiment, a space between the common electrode CME and the first control electrode CTE1 may be relatively widened. In such an embodiment, in the second mode state, the plurality of electrophoretic particles SP may move into the space.

In an embodiment, the display device 102 may further include a touch sensing layer that senses a user's touch. The touch sensing layer may be disposed between the encapsulation layer TFE and the light transmission layer LTL, or may be disposed between the light transmission layer LTL and the common electrode CME.

Since features of the first mode state implementing a wide viewing angle and the first mode state implementing a narrow viewing angle are substantially the same as those described with reference to FIGS. 3A and 3B, any repetitive detailed descriptions thereof will be omitted.

Figure 22A:
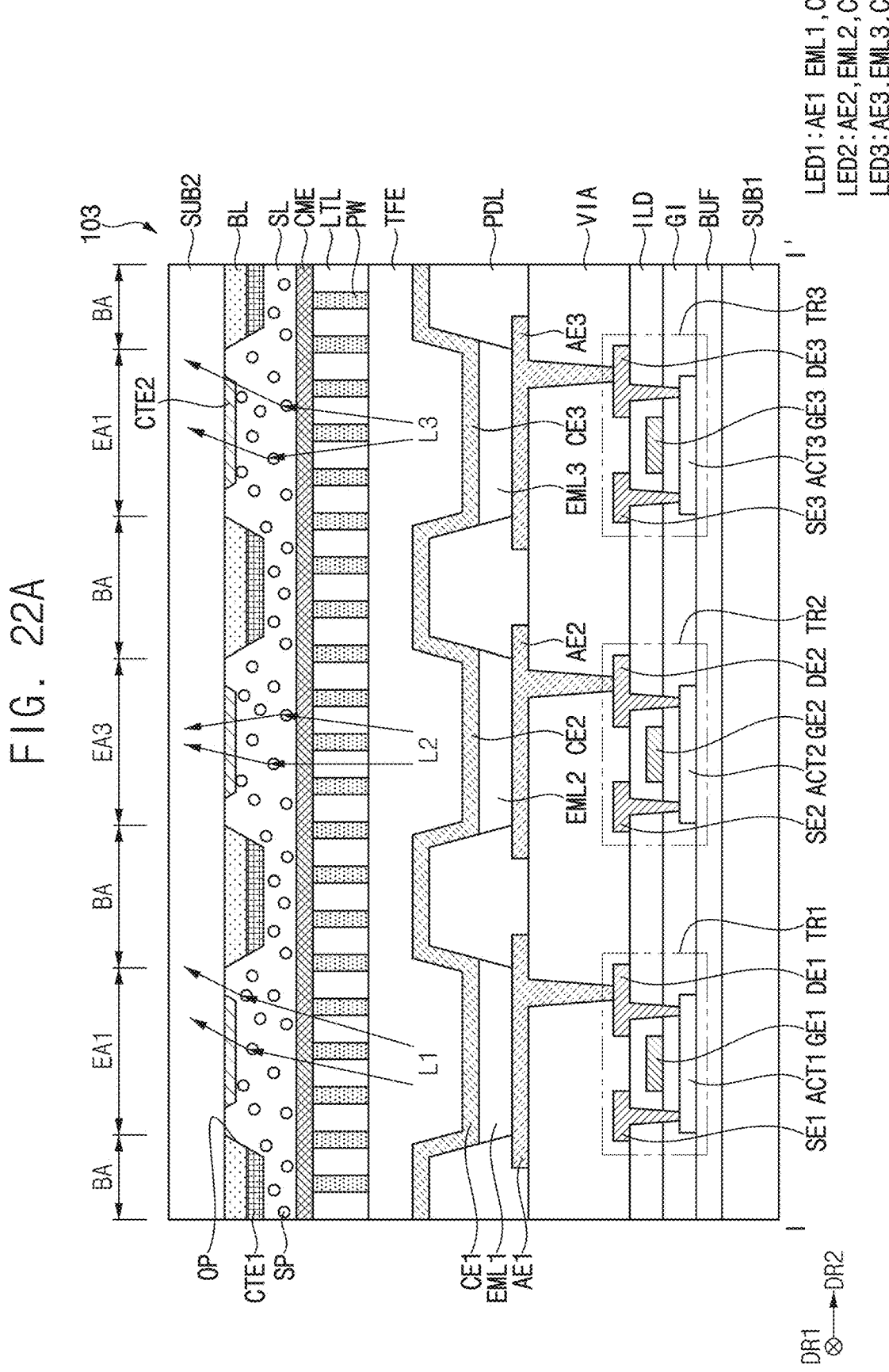
Figure 22B:
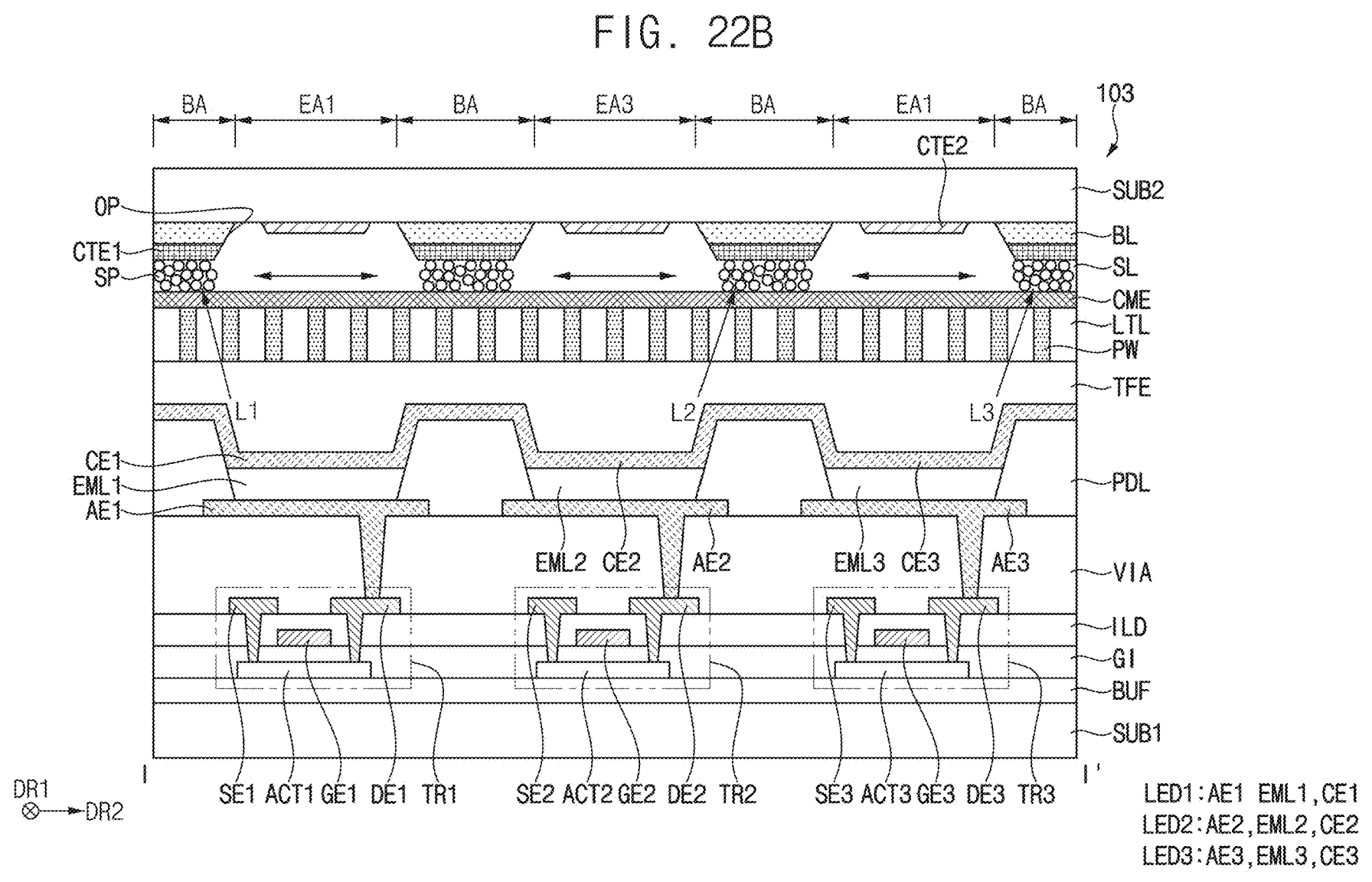

FIGS. 22A and 22B are cross-sectional views illustrating a display device according to still another alternative embodiment of the disclosure. Particularly, FIG. 22A may show a display device 103 in a first mode state, and FIG. 22B may show the display device 103 in a second mode state. Here, the first mode state may mean a mode for implementing a wide viewing angle, and the second mode state may mean a mode for implementing a narrow viewing angle.

Referring to FIGS. 22A and 22B, the display device 103 according to an embodiment of the disclosure may include a first substrate SUB1, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements LED1, LED2, and LED3, an encapsulation layer TFE, a light transmission layer LTL, a plurality of light control patterns PW, a common electrode CME, a solvent layer SL, a plurality of electrophoretic particles SP, a first control electrode CTE1, a second control electrode CTE2, a light blocking layer BL, and a second substrate SUB2.

The display device 103 described with reference to FIGS. 22A and 22B may be substantially the similar as or similar to the display device 100 described with reference to FIGS. 3A and 3B except that the display device 103 further includes the second control electrode CTE2. In the following, any repetitive detailed descriptions of the same or like elements as those describe above will be omitted or simplified.

In an embodiment, the second control electrode CTE2 may be disposed under the second substrate SUB2. The second control electrode CTE2 may overlap the light emitting area (e.g., the first, second, and third light emitting areas EA1, EA2, and EA3 of FIG. 2). In an embodiment, the second control electrode CTE2 may be disposed in the opening OP of the light blocking layer BL. Accordingly, in the second mode state, movement of the plurality of electrophoretic particles SP may be facilitated.

In an embodiment, the display device 103 may further include a touch sensing layer that senses a user's touch. The touch sensing layer may be disposed between the encapsulation layer TFE and the light transmission layer LTL, or may be disposed between the light transmission layer LTL and the common electrode CME.

Hereinafter, the first mode state implementing a wide viewing angle and the second mode state implementing a narrow viewing angle in an embodiment shown in FIGS. 22A and 22B will be described.

In the first mode state, the plurality of electrophoretic particles SP may be dispersed in the solvent layer SL. In first mode state, no voltage may be applied to the common electrode CME, the first control electrode CTE1, and the second control electrode CTE2.

For example, the first light L1 emitted from the first light emitting element LED1 and passed through areas between the plurality of light control patterns PW may collide with the plurality of electrophoretic particles SP and be scattered. The second light L2 emitted from the second light emitting element LED2 and passed through areas between the plurality of light control patterns PW may collide with the plurality of electrophoretic particles SP and be scattered. In addition, the third light L3 emitted from the third light emitting element LED3 and passed through areas between the plurality of light control patterns PW may collide with the plurality of electrophoretic particles SP and may be scattered.

That is, in the first mode state, since the light passed through areas between the plurality of light control patterns PW and having a controlled viewing angle is scattered by the plurality of electrophoretic particles SP, the viewing angle control effect by the plurality of light control patterns PW may be nullified.

In such an embodiment, in the second mode state, a voltage may be applied to each of the common electrode CME, the first control electrode CTE1, and the second control electrode CTE2. In such an embodiment, a first voltage may be applied to the common electrode CME, and a second voltage may be applied to the first control electrode CTE2. The first voltage and the second voltage may have different magnitudes or voltages levels. In addition, the first voltage may be applied to the second control electrode CTE2. Accordingly, an electric field may be formed between the common electrode CME and the first control electrode CTE1, and the plurality of electrophoretic particles SP, which are charged particles having electric charges, may move inside the solvent layer SL by the coulomb force.

In an embodiment, for example, where the plurality of electrophoretic particles SP are positively charged, the first voltage may be a positive voltage and the second voltage may be a negative voltage. Alternatively, where the plurality of electrophoretic particles SP are positively charged, each of the first voltage and the second voltage may be a positive voltage, and the second voltage may be lower than the first voltage.

In an embodiment, for example, where the plurality of electrophoretic particles SP are negatively charged, the first voltage may be a negative voltage and the second voltage may be a positive voltage. Alternatively, where the plurality of electrophoretic particles SP are negatively charged, each of the first voltage and the second voltage may be a negative voltage, and the second voltage may be lower than the first voltage.

In an embodiment, for example, where the first voltage is in a range of about 6 V to about 7 V, the second voltage may be higher than the first voltage. Alternatively, where the first voltage is in a range of about 6 V to about 7 V, the second voltage may be lower than the first voltage. Alternatively, where the first voltage is in a range of about 6 V to about 7 V, the second voltage may be an alternating current (AC) voltage. However, embodiments of the disclosure are not limited thereto.

As voltages having different magnitudes are applied to each of the common electrode CME and the first control electrode CTE1, the plurality of electrophoretic particles SP may move to a space between the common electrode CME and the first control electrode CTE1.

That is, the plurality of electrophoretic particles SP may move in the horizontal direction of the first substrate SUB1.

In an embodiment, for example, the first light L1 emitted from the first light emitting element LED1 and passed through areas between the plurality of light control patterns PW may be scattered by the plurality of electrophoretic particles SP and the scattered first light L1 may be blocked by the light blocking layer BL. The second light L2 emitted from the second light emitting element LED2 and passed through areas between the plurality of light control patterns PW may be scattered by the plurality of electrophoretic particles SP and the scattered second light L2 may be blocked by the light blocking layer BL. In addition, the third light L3 emitted from the third light emitting element LED3 and passed through areas between the plurality of light control patterns PW may be scattered by the plurality of electrophoretic particles SP and the scattered third light L3 may be blocked by the light blocking layer BL.

In an embodiment, in the second mode state, since the light passed through areas between the plurality of light control patterns PW and having a controlled viewing angle is scattered and blocked by the plurality of electrophoretic particles SP and the light blocking layer BL, the viewing angle controlled by the plurality of light control patterns PW may be further controlled.

Figure 23:
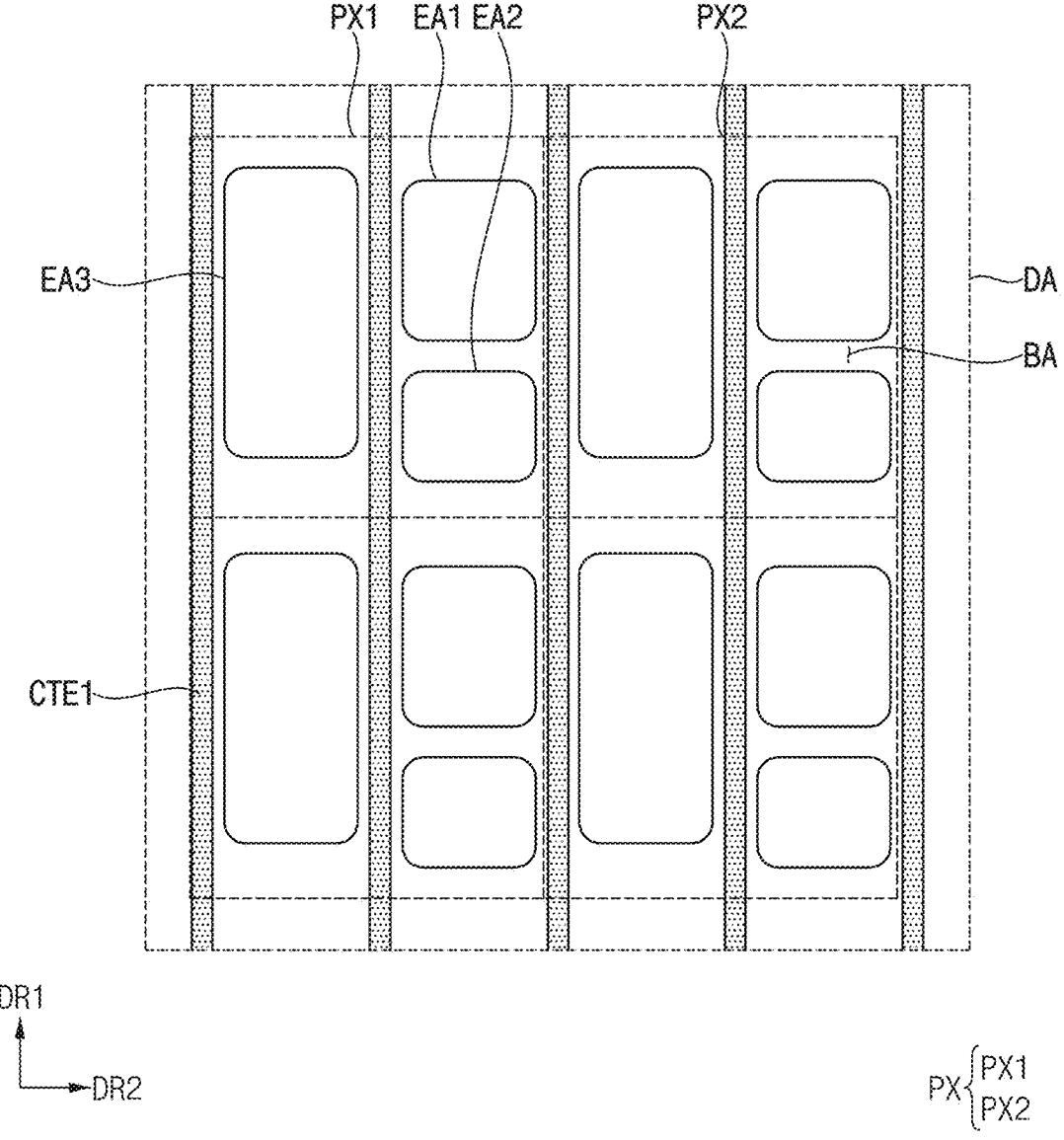
FIG. 23 is a plan view illustrating a first control electrode of FIGS. 22A and 22B.

FIG. 23 is a plan view illustrating a first control electrode of FIGS. 22A and 22B.

Referring to FIG. 23, the first control electrode CTE1 may be disposed in the non-light emitting area BA. That is, the first control electrode CTE1 may overlap the non-light emitting area BA and might not overlap the first, second, and third light emitting areas EA1, EA2, and EA3.

In an embodiment, the first control electrode CTE1 may include a plurality of first electrode patterns. In such an embodiment, the plurality of first electrode patterns may be spaced apart from each other in the second direction DR2. In addition, each of the plurality of first electrode patterns may extend in the first direction DR1. However, embodiments of the disclosure are not limited thereto, and the first control electrode CTE1 may have various planar shapes as long as the first control electrode CTE1 overlaps at least a part of the non-light emitting area BA.

Figure 24:
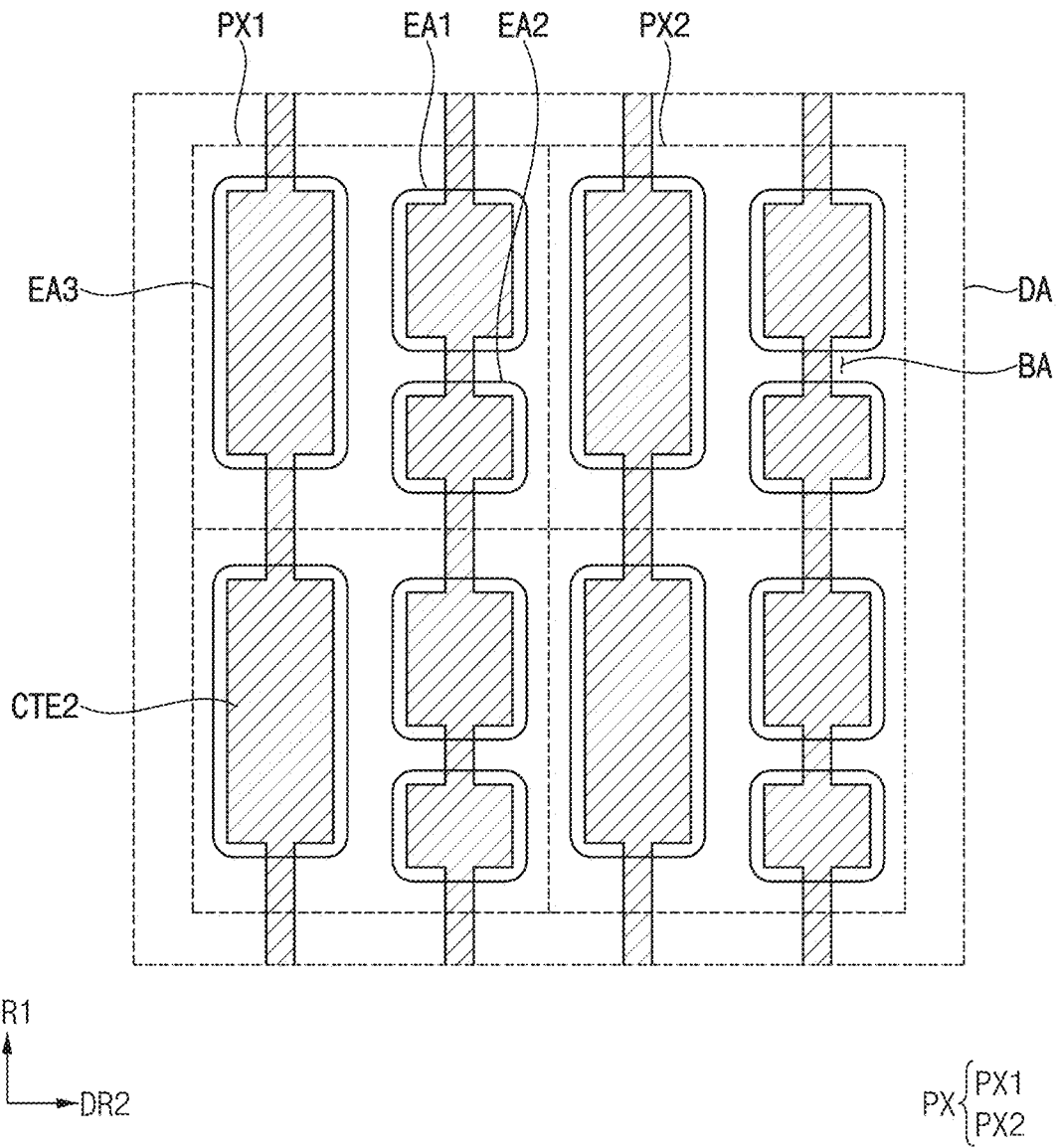
FIG. 24 is a plan view illustrating a second control electrode of FIGS. 22A and 22B.

FIG. 24 is a plan view illustrating a second control electrode of FIGS. 22A and 22B.

Referring to FIG. 24, the second control electrode CTE2 may overlap the first, second, and third light emitting areas EA1, EA2, and EA3.

In an embodiment, the second control electrode CTE2 may include a plurality of second electrode patterns. In such an embodiment, the plurality of second electrode patterns may be spaced apart from each other in the second direction DR2. In addition, each of the plurality of second electrode patterns may extend in the first direction DR1.

In an embodiment, the second control electrode CTE2 may overlap the first, second, and third light emitting areas EA1, EA2, and EA3 and may partially overlap the non-emitting area BA.

In an embodiment, for example, the width of each part of the plurality of second electrode patterns overlapping the non-light emitting area BA may be less than the width of each part of the plurality of second electrode patterns overlapping the first, second, and third light emitting areas EA1, EA2, and EA3. Alternatively, the width of each of the plurality of second electrode patterns may be constant toward the first direction DR1.

However, embodiments of the disclosure are not limited thereto, and the second control electrode CTE2 may have various planar shapes as long as the second control electrode CTE2 overlaps at least a part of each of the first, second, and third light emitting areas EA1, EA2, and EA3.

Figure 25:
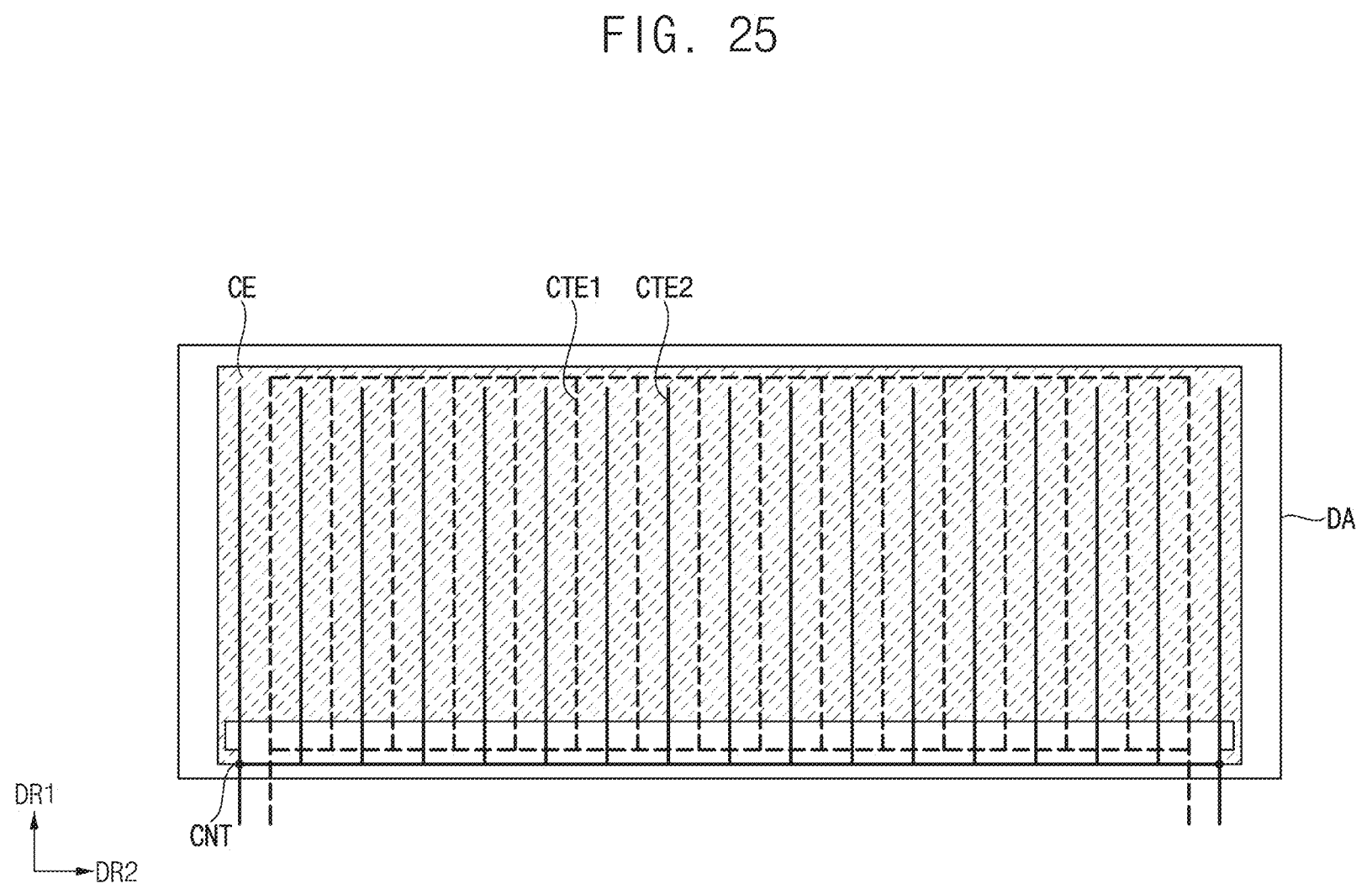

FIG. 25 is a plan view illustrating a cathode electrode, a first control electrode, and a second control electrode of FIGS. 22A and 22B.

Referring to FIG. 25, in an embodiment, the second control electrode CTE2 may be electrically connected to the cathode electrode CE through a contact hole CNT. Specifically, the second control electrode CTE2 may be electrically connected to an end of the cathode electrode CE adjacent to an edge of the display area DA through the contact hole CNT. The cathode electrode CE may correspond to the first, second, and third cathode electrodes CE1, CE2, and CE3 shown in FIGS. 22A and 22B.

In an embodiment, the second control electrode CTE2 may receive a common voltage. In an alternative embodiment, the second control electrode CTE2 may receive a driving voltage. However, embodiments of the disclosure are not limited thereto. In an embodiment, for example, a voltage may be applied to the second control electrode CTE2 through a separate pad.

Figure 26A:
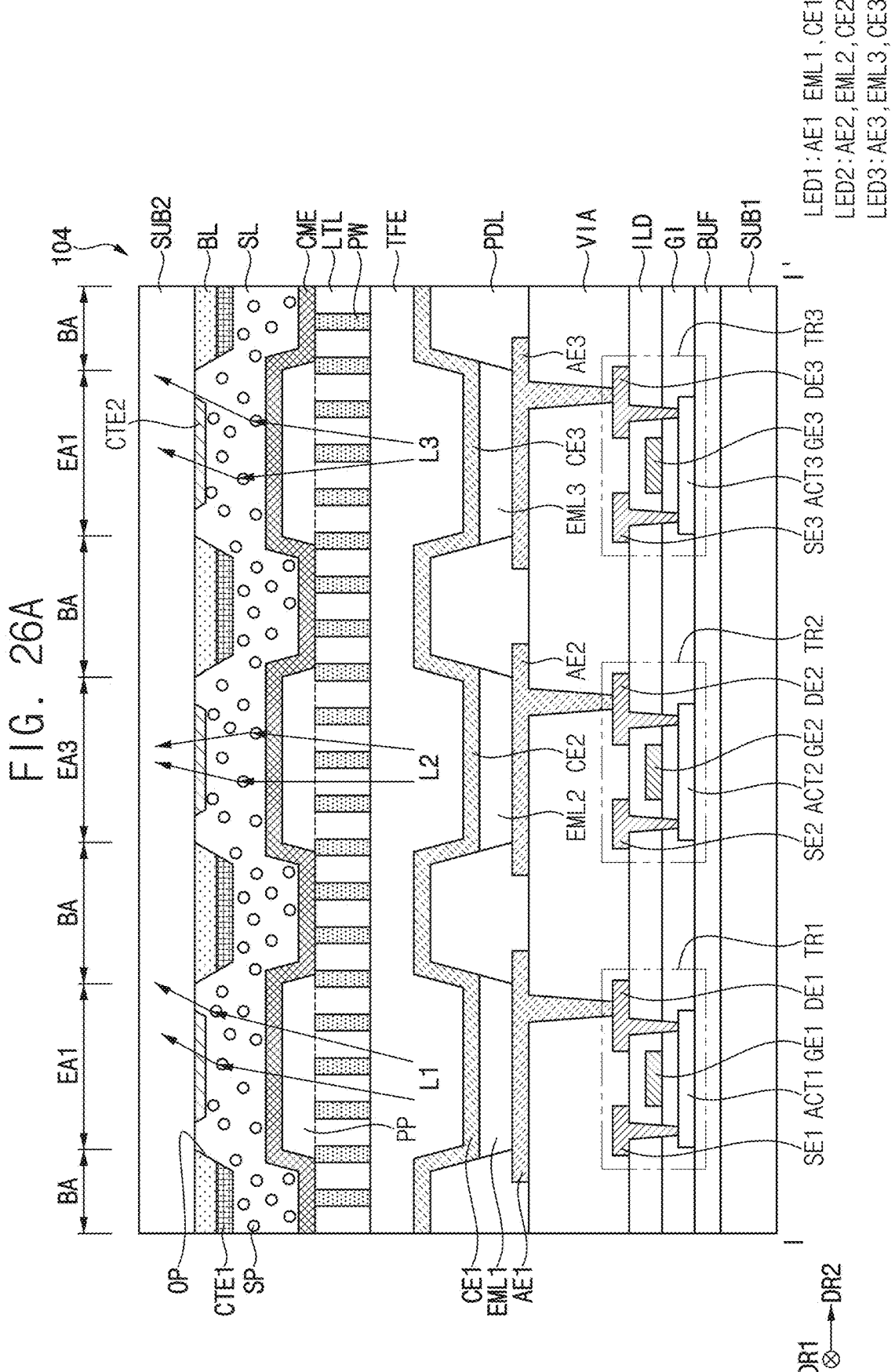
FIGS. 26A and 26B is a plan view illustrating a display device according to still another alternative embodiment of the disclosure.
Figure 26B:
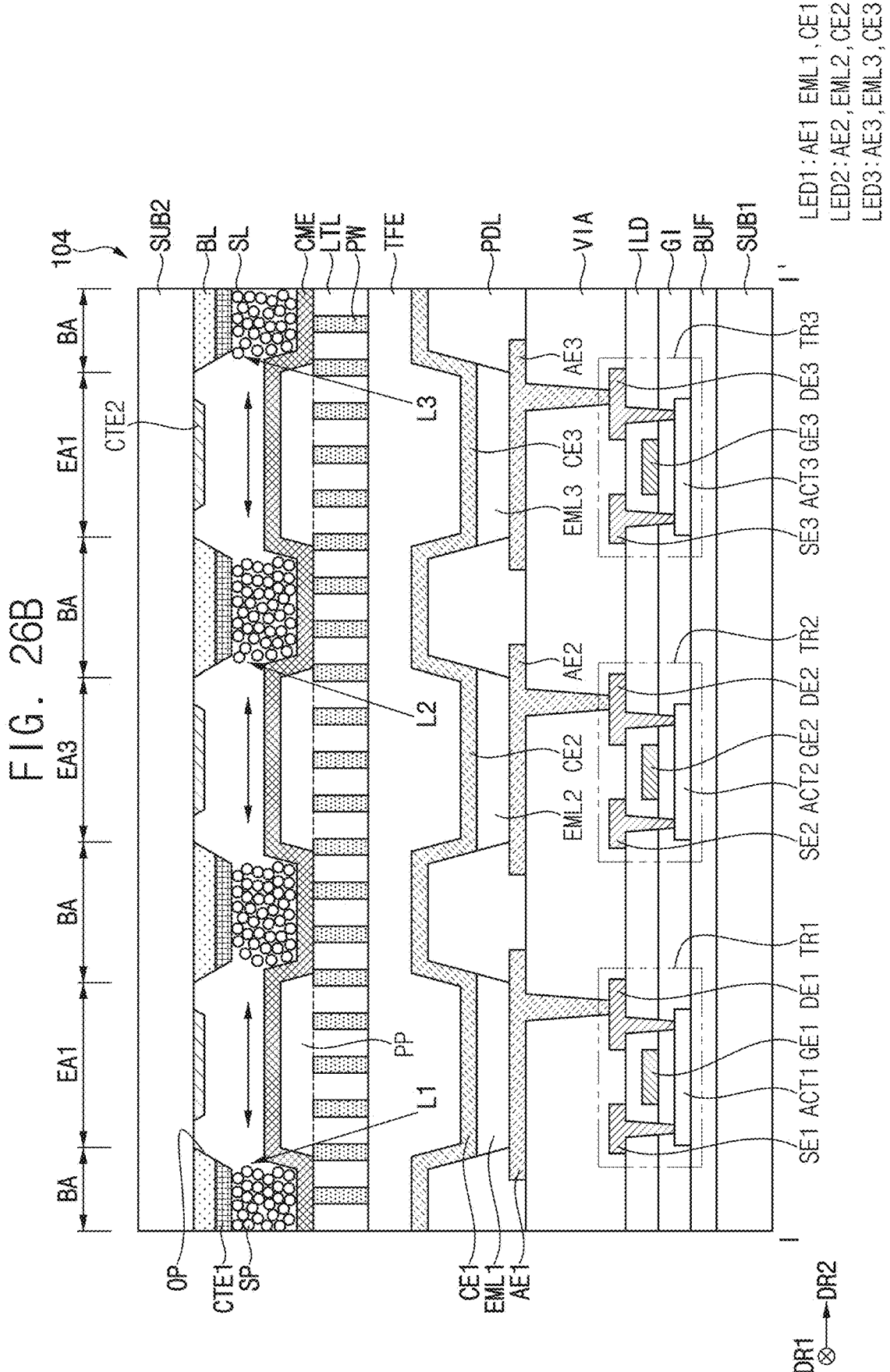

FIGS. 26A and 26B is a plan view illustrating a display device according to still another alternative embodiment of the disclosure. Particularly, FIG. 26A may show a display device 104 in a first mode state, and FIG. 26B may show the display device 104 in a second mode state. Here, the first mode state may mean a mode for implementing a wide viewing angle, and the second mode state may mean a mode for implementing a narrow viewing angle.

Referring to FIGS. 26A and 26B, the display device 104 according to an embodiment of the disclosure may include a first substrate SUB1, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements LED1, LED2, and LED3, an encapsulation layer TFE, a light transmission layer LTL, a plurality of light control patterns PW, a common electrode CME, a solvent layer SL, a plurality of electrophoretic particles SP, a first control electrode CTE1, a second control electrode CTE2, a light blocking layer BL, and a second substrate SUB2.

the display device 104 described with reference to FIGS. 26A and 26B may be substantially the similar as or similar to the display device 102 described with reference to FIGS. 21A and 21B except that the display device 104 further includes the second control electrode CTE2. In the following, any repetitive detailed descriptions of the same or like elements as those described above will be omitted or simplified.

In an embodiment, the light transmission layer LTL may include a protrusion part PP protruding from an upper surface of the light transmission layer LTL toward the second substrate SUB2. That is, in the light transmission layer LTL, a step structure may be defined between the non-light emitting area BA and the light emitting area. In such an embodiment, a height of a part of the light transmitting layer LTL overlapping the light emitting area may be greater than a height of a part of the light transmitting layer LTL overlapping the non-emitting area BA. In such an embodiment, a space between the common electrode CME and the first control electrode CTE1 may be relatively widened. Accordingly, in the second mode state, the plurality of electrophoretic particles SP may move into the space.

In an embodiment, the second control electrode CTE2 may be disposed under the second substrate SUB2. The second control electrode CTE2 may overlap the light emitting area (e.g., the first, second, and third light emitting areas EA1, EA2, and EA3 of FIG. 2). In an embodiment, for example, the second control electrode CTE2 may be disposed in the opening OP of the light blocking layer BL. Accordingly, in the second mode state, movement of the plurality of electrophoretic particles SP may be facilitated.

In an embodiment, the display device 104 may further include a touch sensing layer that senses a user's touch. The touch sensing layer may be disposed between the encapsulation layer TFE and the light transmission layer LTL, or may be disposed between the light transmission layer LTL and the common electrode CME.

Since features of the first mode state implementing a wide viewing angle and the first mode state implementing a narrow viewing angle are substantially the same as those described with reference to FIGS. 22A and 22B, any repetitive detailed description thereof will be omitted.

Referring back to FIGS. 3A, 3B, 20A, 20B, 21A, 21B, 22A, 22B, 26A, and 26B, a display device according to embodiments of the disclosure may include the plurality of light control patterns PW disposed on the first substrate SUB1 and spaced apart from each other, the common electrode CME disposed on the plurality of light control patterns PW, the light blocking layer BL disposed on the common electrode CME and overlapping the non-light emitting area BA, the solvent layer SL disposed between the common electrode CME and the light blocking layer BL, the plurality of electrophoretic particles SP positioned inside the solvent layer SL and movable in the horizontal direction of the first substrate SUB1, and the first control electrode CTE disposed between the common electrode CME and the light blocking layer BL, and overlapping the non-light emitting area BA.

Accordingly, in such embodiments, since the display device does not include a separate light blocking film for controlling the viewing angle, a thickness of the display device can be reduced and the manufacturing cost of the display device can be reduced. In such embodiments, the first mode state implementing a wide viewing angle and the second mode state implementing a narrow viewing angle can be freely switched as desired.

Figure 28:
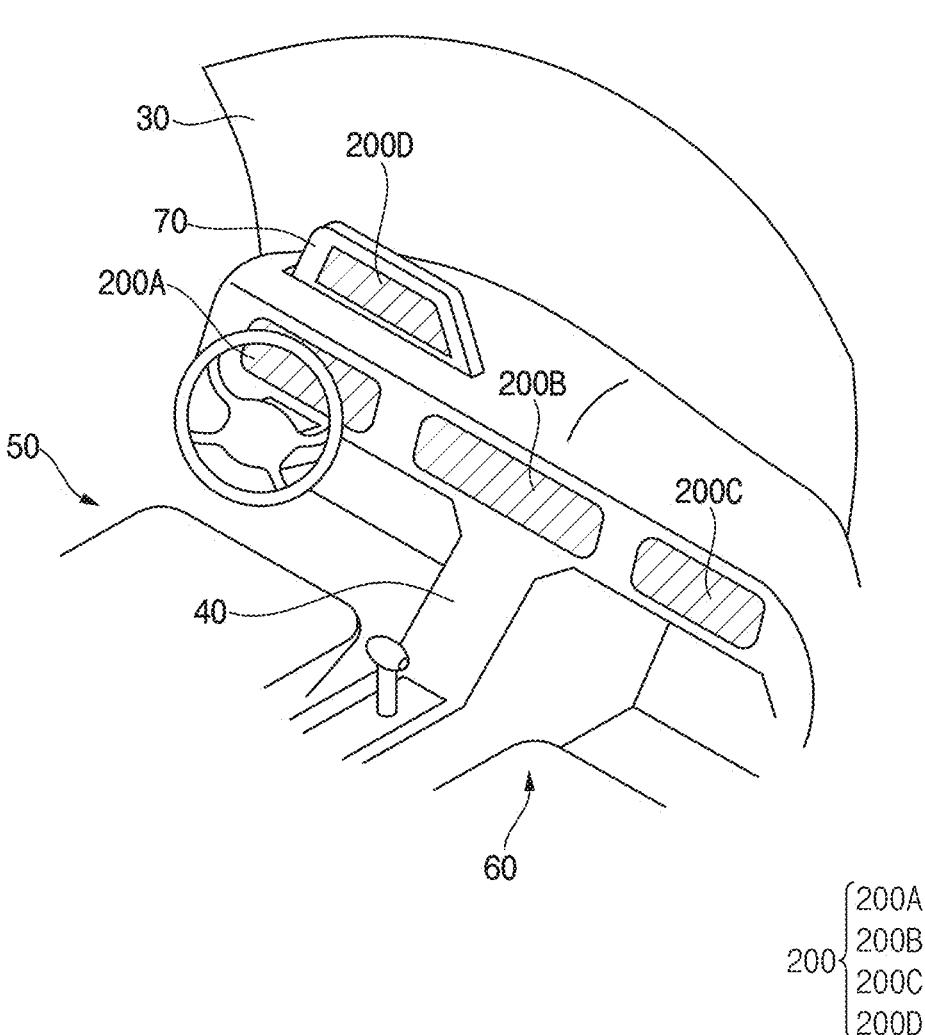
FIG. 28 is a view illustrating the inside of the automobile of FIG. 27.

FIG. 27 is a schematic view of an automobile. FIG. 28 is a view illustrating the inside of the automobile of FIG. 27.

Referring to FIGS. 27 and 28, an automobile 10 may include a vehicle body 20 and a vehicle display device 200. The body 20 may form the exterior of the automobile 10 and may define an indoor space in which a driver and a passenger ride. The vehicle body 20 may include a windshield 30 that protects the driver and passenger from the outside and provides the driver with a view. The vehicle display device 200 may be disposed in the indoor space.

The vehicle display device 200 may include first, second, third, and fourth display devices 200A, 200B, 200C, and 200D. The first, second, and third display devices 200A, 200B, and 200C may be disposed on the dashboard 40 provided in the indoor space. For example, the first display device 200A may be disposed on the dashboard 40 in front of a driver seat 50 to provide speed information or the like to the driver. The second display device 200B may be disposed in the center of the dashboard 40 to provide map information or the like. In addition, the third display device 200C may be disposed on the dashboard 40 in front of a passenger seat 60 to provide entertainment information to a passenger.

In addition, the fourth display device 200D may be included in a head-up vehicle display 70. The head-up vehicle display 70 may be disposed on the dashboard 40. For example, the fourth display device 200D may provide the driver with information helpful for driving.

The third display device 200C disposed on the dashboard 40 may adjust the viewing angle according to the mode. In an embodiment, the third display device 200C may display an image in a wide viewing angle mode or a narrow viewing angle mode. For example, the wide viewing angle mode may mean a state in which the viewing angle of the third display device 200C is wide. In the wide viewing angle mode, an image may be displayed to the driver in the driver seat 50 as well as the passenger in the passenger seat 60. Accordingly, both the passenger and the driver may be allowed to view the image of the third display device 200C. The narrow viewing angle mode may mean a state in which the field of view of the third display device 200C is narrow. In the narrow viewing angle mode, an image may be displayed only to the passenger in the passenger seat 60, and may not be displayed to the driver in the driver seat 50. Therefore, only the passenger may be allowed to view the image of the third display device 200C.

Although the description has been made based on the third display device 200C disposed on the dashboard 40, the disclosure is not limited thereto. For example, the viewing angle of each of the first display device 200A, the second display device 200B, and the fourth display device 200D may be variously adjusted according to the mode.

In addition, although it has been described that the vehicle display device 200 is disposed on the dashboard 40, the disclosure is not limited thereto. For example, the vehicle display device 200 may be disposed on the windshield 30.

At least one selected from the first, second, third, and fourth display devices 200A, 200B, 200C, and 200D may have substantially the same structure as an embodiment of the display device 100, 101, 102, 103, or 104 described above with reference to FIGS. 3A, 3B, 20A, 20B, 21A, 21B, 22A, 22B, 26A, and 26B. In an embodiment, for example, the third display device 200C may have substantially the same structure as an embodiment of the display device 100, 101, 102, 103, or 104 described above with reference to FIGS. 3A, 3B, 20A, 20B, 21A, 21B, 22A, 22B, 26A, and 26B.

Embodiments of the disclosure can be applied to various display devices, for example, display devices for vehicles, ships and aircraft, portable communication devices, display devices for exhibition or information transmission, medical display devices, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate on which a light emitting area and a non-light emitting area adjacent to the light emitting area are defined;
   a plurality of light control patterns disposed on the substrate and spaced apart from each other;
   a common electrode disposed on the plurality of light control patterns;
   a light blocking layer disposed on the common electrode and overlapping the non-light emitting area;
   a solvent layer disposed between the common electrode and the light blocking layer;
   a plurality of electrophoretic particles dispersed in the solvent layer and movable in a horizontal direction of the substrate; and
   a first control electrode disposed between the common electrode and the light blocking layer, and overlapping the non-light emitting area.

2. The display device of claim 1, wherein when a first voltage is applied to the common electrode and a second voltage having a magnitude different from a magnitude of the first voltage is applied to the first control electrode, the plurality of electrophoretic particles moves into a space between the common electrode and the first control electrode.

3. The display device of claim 1, wherein the first control electrode directly contacts one surface of the light blocking layer facing the substrate.

4. The display device of claim 1, further comprising:
   a light transmission layer disposed between the plurality of light control patterns on the substrate and including a transparent organic material.

5. The display device of claim 4, wherein the light transmission layer includes a protruding part protruding toward the common electrode from an upper surface of the transmission layer and overlapping the light emitting area.

6. The display device of claim 1, further comprising:
   a second control electrode disposed on the common electrode and overlapping the light emitting area.

7. The display device of claim 6, wherein when a first voltage is applied to the common electrode, a second voltage having a magnitude different from a magnitude of the first voltage is applied to the first control electrode, and the first voltage is applied to the second control electrode, the plurality of electrophoretic particles moves into a space between the common electrode and the first control electrode.

8. The display device of claim 6, wherein
   an opening overlapping the light emitting area is defined in the light blocking layer, and
   the second control electrode is disposed in the opening.

9. The display device of claim 6, wherein
   the first control electrode includes a plurality of first electrode patterns spaced apart from each other in a first direction, and
   each of the plurality of first electrode patterns extends in a second direction crossing the first direction.

10. The display device of claim 9, wherein
   the second control electrode includes a plurality of second electrode patterns spaced apart from each other in the first direction, and
   each of the plurality of first electrode patterns extends in the second direction.

11. The display device of claim 10, wherein the second control electrode partially overlaps the non-light emitting area.

12. The display device of claim 6, wherein a driving voltage or a common voltage is applied to the second control electrode.

13. The display device of claim 6, further comprising:
   an anode electrode disposed in the light emitting area on the substrate;
   a light emitting layer disposed on the anode electrode; and
   a cathode electrode disposed on the light emitting layer.

14. The display device of claim 13, wherein the second control electrode is electrically connected to the cathode electrode.

15. The display device of claim 6, further comprising:
   a light transmission layer disposed between the plurality of light control patterns on the substrate and including a transparent organic material,
   wherein the light transmission layer includes a protruding part protruding toward the common electrode from an upper surface of the transmission layer and overlapping the light emitting area.

16. The display device of claim 1, wherein each of the plurality of electrophoretic particles is a transparent light scattering particle.

17. The display device of claim 1, wherein each of the plurality of light control patterns includes molybdenum tantalum oxide.

18. The display device of claim 1, wherein each of the plurality of light control patterns includes an organic material including at least one selected from black pigment and a black dye.

19. The display device of claim 1, wherein each of the plurality of light control patterns has a multi-layer structure.

20. The display device of claim 19, wherein each of the plurality of light control patterns has a two-layer structure including a first sub-partition wall and a second sub-partition wall disposed on the first sub-partition wall.

21. The display device of claim 19, wherein each of the plurality of light control patterns has a three-layer structure including a first sub-partition wall, a second sub-partition wall disposed on the first sub-partition wall, and a third sub-partition wall disposed on the second sub-partition wall.

22. The display device of claim 1, wherein the plurality of light control patterns are spaced apart from each other in a first direction, and each of the plurality of light control patterns extends in a second direction crossing the first direction.

23. The display device of claim 1, further comprising:

a touch sensing layer disposed between the substrate and the common electrode, wherein the touch sensing layer senses a touch of a user.

24. A display device comprising:

a substrate on which first, second, and third light emitting areas, which emit light of different colors, and a non-light emitting area adjacent to the first, second, and third light emitting areas are defined;

a plurality of light control patterns disposed on the substrate, overlapping the first, second, and third light emitting areas and the non-light emitting area, and spaced apart from each other;

a common electrode disposed on the plurality of light control patterns and overlapping the first, second, and third light emitting areas;

a light blocking layer disposed on the common electrode and overlapping the non-light emitting area;

a solvent layer disposed between the common electrode and the light blocking layer;

a plurality of electrophoretic particles dispersed in the solvent layer and movable in a horizontal direction of the substrate; and a first control electrode disposed between the common electrode and the light blocking layer, and overlapping the non-light emitting area.

25. The display device of claim 24, wherein when a first voltage is applied to the common electrode and a second voltage having a magnitude different from a magnitude of the first voltage is applied to the first control electrode, the plurality of electrophoretic particles move into a space between the common electrode and the first control electrode.

26. The display device of claim 24, wherein the first control electrode directly contacts one surface of the light blocking layer facing the substrate.

27. The display device of claim 24, further comprising:

a light transmission layer disposed between the plurality of light control patterns on the substrate and including a transparent organic material, wherein the light transmission layer includes a protruding part protruding toward the common electrode from an upper surface of the transmission layer and overlapping the first, second, and third light emitting areas.

28. The display device of claim 24, further comprising:

a second control electrode disposed on the common electrode and overlapping the light emitting area, wherein when a first voltage is applied to the common electrode, a second voltage having a magnitude different from a magnitude of the first voltage is applied to the first control electrode, and the first voltage is applied to the second control electrode, the plurality of electrophoretic particles move into a space between the common electrode and the first control electrode.

29. The display device of claim 24, wherein each of the plurality of electrophoretic particles is a transparent light scattering particle.

30. The display device of claim 24, wherein each of the plurality of light control patterns includes an inorganic material or an organic material.

\* \* \* \* \*